(12) United States Patent
Hirota et al.

(10) Patent No.: US 7,576,778 B2
(45) Date of Patent: Aug. 18, 2009

(54) SHAKE CORRECTING MECHANISM AND CAMERA HAVING SAME SHAKE CORRECTING MECHANISM

(75) Inventors: Toshihiko Hirota, Sakai (JP); Mitsuhiro Sugita, Gose (JP); Yoshiharu Tanaka, Kawachinagano (JP)

(73) Assignee: Konica Minolta Photo Imaging, Inc., Tokyo (JP)

( * ) Notice: Subject to any disclaimer, the term of this patent is extended or adjusted under 35 U.S.C. 154(b) by 547 days.

(21) Appl. No.: 11/218,837

(22) Filed: Sep. 2, 2005

(65) Prior Publication Data

US 2006/0055787 A1 Mar. 16, 2006

(30) Foreign Application Priority Data

Sep. 10, 2004 (JP) ............................. 2004-264408

(51) Int. Cl.
 *H04N 5/228* (2006.01)
(52) U.S. Cl. ............................. 348/208.5; 348/208.99
(58) Field of Classification Search ............ 348/208.99, 348/208.4, 208.5
 See application file for complete search history.

(56) References Cited

U.S. PATENT DOCUMENTS 4,485,398 A * 11/1984 Chapin et al. ................. 348/81

| 6,940,542 B2 * | 9/2005 | Kitazawa et al. ....... 348/208.99 |
| 7,436,435 B2 * | 10/2008 | Wada ...................... 348/208.4 |
| 2002/0196347 A1 * | 12/2002 | Ishikawa et al. ......... 348/208.5 |

FOREIGN PATENT DOCUMENTS

| JP | 07-218820 | 8/1995 |
| JP | 2002-296479 A | 10/2002 |
| JP | 2003-110929 A | 4/2003 |

* cited by examiner

*Primary Examiner*—Lin Ye
*Assistant Examiner*—Amy Hsu
(74) *Attorney, Agent, or Firm*—Brinks Hofer Gilson & Lione

(57) ABSTRACT

A camera with shake correction mechanism according to the invention comprises: an image pickup device for picking up object light; shake detecting device for detecting a shake exerted to a camera body; a shake correction unit provided with a driving section for exerting a swing force for swinging the image pickup device in a direction perpendicular to the optical axis; a control board on which electronic components are mounted; and a flexible wiring member for electrically connecting the shake correction unit to the control board, wherein the shake correction unit and the control board are arranged at adjacent positions to each other in a direction of almost the same plane, while in an adjacent part of the two elements, a space part is set up that can accommodate the flexible wiring member in a bent state. According to this configuration, in the camera in which a shake correction unit and a control board are arranged at adjacent positions to each other in a direction of almost the same plane so that the thickness size is reduced in the optical axis direction, the flexible wiring member for electrically connecting the two elements can be wired in an optimal manner.

4 Claims, 24 Drawing Sheets

(a)

(b)

← RETRACTING DIRECTION    PROTRUDING DIRECTION →

(a)

(b)

(a)

(b)

SHAKE CORRECTING MECHANISM AND CAMERA HAVING SAME SHAKE CORRECTING MECHANISM

This application is based on Japanese Patent Application No. 2004-264408 filed in Japan on 10 Sep. 2004, the entire content of which is hereby incorporated by reference.

FIELD OF THE INVENTION

The present invention relates to a shake correction mechanism for correcting a camera shake or the like and to a camera with shake correction mechanism such as a digital still camera and a digital video camera provided with a shake correction mechanism.

DESCRIPTION OF RELATED ART

As an example of an active type shake correction mechanism for swinging all or part of an optical system and thereby correcting deviation of the photographing optical axis caused by a camera shake or the like, JP-A No. 2003-110929 (Patent Document 1, hereafter) discloses a shake correction mechanism of the type that the image pickup device is swung. This shake correction mechanism of image pickup device swing type avoids the necessity of a lens dedicated for shake correction. Thus, even a small mechanism advantageously realizes shake correction suitable for a high definition system. In such a shake correction mechanism, in general, a piezoelectric actuator or the like arranged in a side end part of the image pickup device exerts a swing force for swinging the image pickup device in a direction perpendicular to the optical axis.

As for the manner of built-in of the shake correction mechanism into the camera body case, in the camera with shake correction mechanism of the Patent Document 1, a shake correction unit provided with a driving section for exerting a swing force for swinging the image pickup device in a direction perpendicular to the optical axis and a control board provided with an ASIC (Application Specific Integrated Circuit) serving as a semiconductor circuit device for image processing and a drive control circuit or the like for the driving section are arranged in a manner stacked to each other in the optic axis direction. The control board and the shake correction unit (image pickup device) are electrically connected through a flexible wiring board.

Meanwhile, in the flexible wiring board, in general, a plurality of conductors are aligned and arranged at predetermined intervals in the transverse direction, while the upper and lower surfaces are sealed with insulating films so that the entire board has a belt shape. That is, the flexible wiring board can easily be bent or deformed in such a manner that the belt-shaped plane serves as the bending surface. Thus, for example, when the flexible wiring board is used for the electrical connection between a fixed body and a movable body, wiring arrangement is determined in such a manner that the direction of motion of the movable body matches with the bending direction of the flexible wiring board. For example, JP-A No. 2002-296479 (Patent Document 2) and JP-A No. H7-218820 (Patent Document 3) disclose an electrical connection structure between a lens tube of tube retraction type and a main body where wiring is arranged such that a flexible wiring board should be bent in the direction of motion of the lens tube.

Nevertheless, as in the camera with shake correction mechanism of Patent Document 1, when the shake correction unit and the control board are built into the camera body case in a manner stacked in the optical axis direction, the thickness size increases unavoidably in the optical axis direction of the camera, and hence prevents the size reduction of the camera.

Thus, in another possible built-in manner, the shake correction unit and the control board can be arranged in a direction of almost the same plane perpendicular to the optical axis. In this case, the electrical connection structure between the shake correction unit and the control board through the flexible wiring board need be optimized. That is, the image pickup device swung by the shake correction unit and the control circuit which are in the relation between the above-mentioned movable body and the fixed body. Further, in contrast to the simple motion of one axis direction in the case of the lens tube of Patent Documents 2 and 3, the image pickup device is swung in two distinct axis directions for the shake correction. Thus, in the setup of the electrical connection structure between the two elements through the flexible wiring board, deforming forces to the flexible wiring board in the two axis directions need be taken into consideration, so that such a structure should be adopted that the deforming forces do not cause a problem such as disconnection and further do not block the swing operation performed by the shake correction unit.

SUMMARY OF THE INVENTION

Thus, in a digital still camera, a digital video camera, or the like comprising a shake correction unit and a control board in the form of distinct members (separate structures), an object of the invention is to provide a camera with shake correction mechanism in which the electrical connection structure between the two elements through the flexible wiring board is optimized.

The above-mentioned object is achieved by providing the following configuration.

A camera with shake correction mechanism according to the invention comprises: an image pickup device for picking up object light; shake detecting devise for detecting a shake exerted to a camera body; a shake correction unit provided with a driving section for exerting a swing force for swinging the image pickup device in a direction perpendicular to the optical axis; a control board on which electronic components are mounted; and a flexible wiring member for electrically connecting the shake correction unit to the control board, wherein the shake correction unit and the control board are arranged at adjacent positions to each other in a direction of almost the same plane, while in an adjacent part of the two elements, a space part is set up that can accommodate the flexible wiring member in a bent state.

According to this configuration, even when the image pickup device is swung in two distinct axis directions by the driving section, the flexible wiring member can follow the motion and deform freely on the basis of the degree of margin provided by the bending in the space part. Thus, even when the deforming forces in the two distinct axis directions act on the flexible wiring member, a problem such as disconnection does not arise, while the flexible wiring member does not block the swing operation of the image pickup device performed by the shake correction unit. Thus, in the camera with shake correction function in which a shake correction unit and a control board are arranged at adjacent positions to each other in a direction of almost the same plane so that the thickness size is reduced in the optical axis direction, the flexible wiring member for electrically connecting the two elements can be wired in an optimal manner.

In the camera, the flexible wiring board is a flexible wiring board in which a plurality of conductors are aligned and arranged at predetermined intervals in a transverse direction, while upper and lower surfaces thereof are sealed with insulating films.

According to this configuration, even in the case of the flexible wiring board having a belt shape where the deformation direction is restrictive, the swing of the image pickup device can be followed so that bending deformation and twist deformation can be performed freely. This provides a camera of such a configuration that the advantage of the compactness of the belt-shaped flexible wiring board is utilized while the swing of the image pickup device is treated appropriately.

Further, in the above-mentioned camera: a mount section to which a taking lens is attached is provided on the front side; a rectangular-tube shaped frame in the inside of which a retractable-type reflecting plate for reflecting object light is arranged is provided; the shake correction unit is attached on the rear side of the frame; and the flexible wiring member is accommodated in a planar space in alignment with a side wall part of the frame.

According to this configuration, since the planar space is prepared in alignment with the side wall part of the rectangular-tube shaped frame, a space where the flexible wiring member is to be bent is easily ensured. In particular, when the flexible wiring board having a belt shape is used, the space where the bending deformation and twist deformation are performed is efficiently ensured. Thus, the flexible wiring member can be accommodated in the space part with an improved deformation follow-up property.

Further, in the above-mentioned camera, in the shake correction unit, a flexible member guide section extends for guiding the flexible wiring member to the space part.

This configuration avoids damage in the flexible wiring member which could be caused by the shake correction of the image pickup device, and hence improves the long term reliability of the camera with shake correction mechanism.

BRIEF DESCRIPTION OF THE DRAWINGS

These and other objects and features of the present invention will become clear from the following description taken in conjunction with the preferred embodiments thereof with reference to the accompanying drawings, in which:

FIG. 4(a) is an external front view of the digital camera, while FIG. 4(b) is an external rear view of the digital camera.

FIG. 16 is a perspective view showing a fixed (adhered) state of an actuator 3a. FIG. 16(a) shows a state that a weight member is adhered at two positions, while FIG. 16(b) shows a state that a weight member is adhered at four positions.

FIG. 17(a) is a schematic diagram showing the configuration of the sensor schematically, while FIG. 17(b) is a graph showing output voltage characteristic.

DETAILED DESCRIPTION OF THE PREFERRED EMBODIMENTS

Embodiments of the invention are described below with reference to the drawings.

First, the invention is outlined below with reference to FIGS. 1-3.

Figure 1:
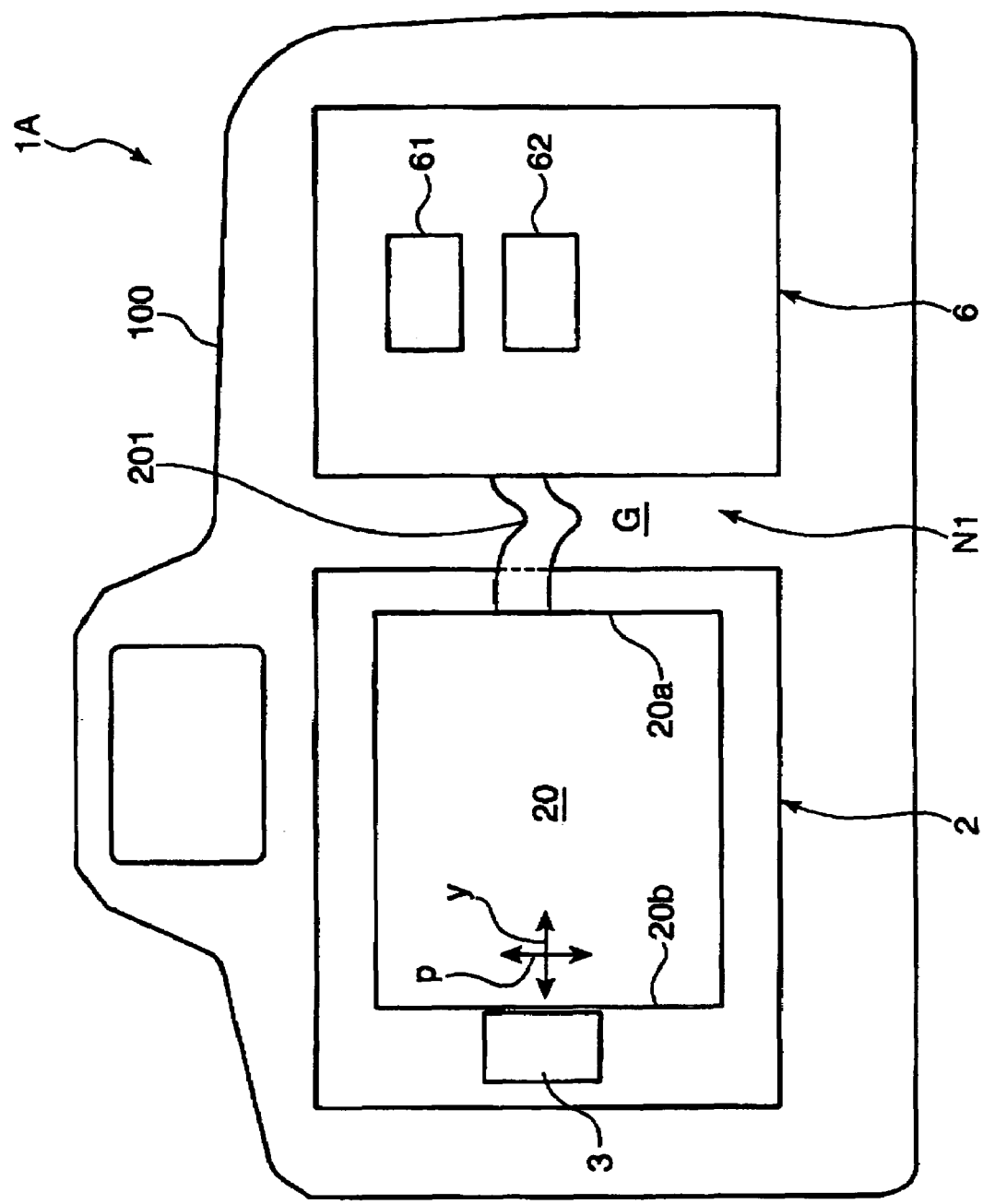
FIG. 1 is a rear view schematically showing the configuration of a camera with shake correction mechanism according to the invention.
Figure 2:
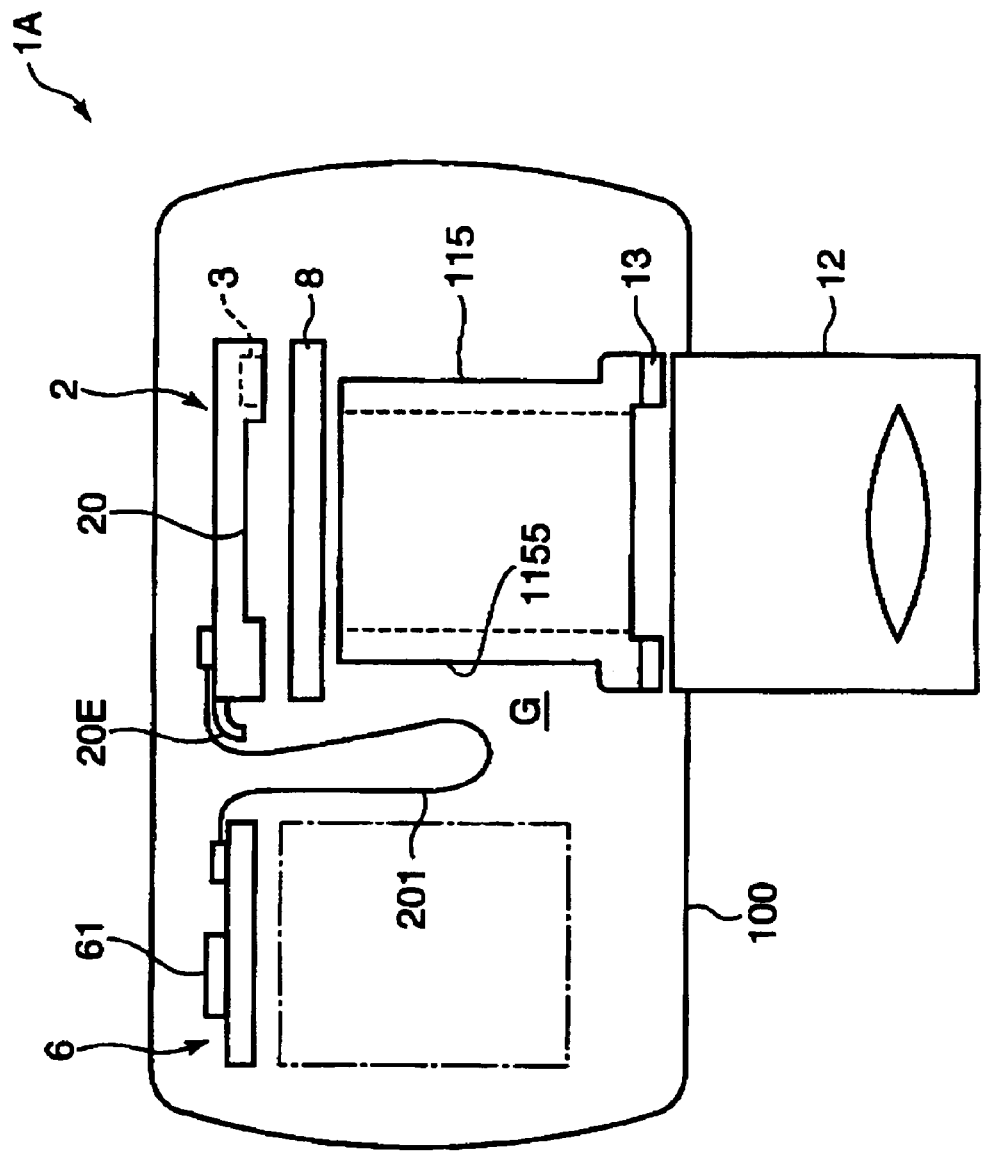
FIG. 2 is a top view schematically showing the configuration of a camera with shake correction mechanism according to the invention.
Figure 3:
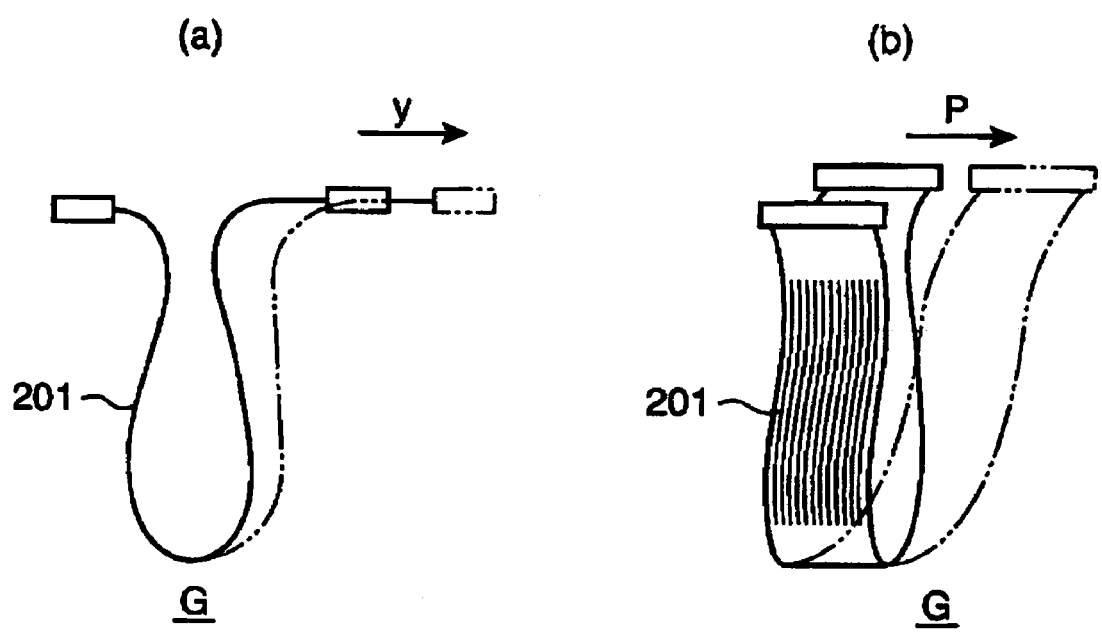
FIG. 3 is a schematic diagram showing a deformed state of a flexible wiring member.

FIGS. 1 and 2 are built-in arrangement diagrams schematically showing the configuration of the invention. FIG. 1 is a rear view, while FIG. 2 is a top view. In this camera with shake correction mechanism 1A, a shake correction unit 2 retaining an image pickup device 20 in a swingable manner and a control board 6 provided with electronic components such as an ASIC 61 and a drive control circuit 62 are arranged inside a body casing 100 at adjacent positions to each other in a direction of almost the same plane. The phrase "arranged at adjacent positions to each other in a direction of almost the same plane" indicates that the two elements are arranged close to each other in a transverse direction (direction perpendicular to the camera optical axis) without overlapping in the optical axis direction. Thus, as long as the shake correction unit 2 and the control board 6 do not overlap with each other in the optical axis direction, the two elements may be built in the body casing 100 at distinct depth positions or height positions. In the shake correction unit 2, a driving section 3 for generating swing forces to swing the image pickup device 20, for example, in a first direction (an arrow p in the figure; pitch direction) perpendicular to the optical axis and a second direction perpendicular to the optical axis and further perpendicular to the first direction (an arrow y in the figure; yaw direction) is provided in a side end part of the image pickup device 20. The driving section 3 may be one of various actuators capable of generating swing forces at least in two axis directions.

The above-mentioned shake correction unit 2 and the control board 6 are electrically interconnected through a flexible wiring board 201. A space part G is set up in an adjacent part N1 between the shake correction unit 2 and the control board 6, so that the flexible wiring member 201 is accommodated in the space part G in a state bend at a predetermined amount of bending. Thus, even when the image pickup device 20 is swung in two distinct axis directions by the driving section 3, the flexible wiring member 201 can follow the motion and deform freely on the basis of the degree of margin provided by the bending. Accordingly, even when deforming forces in the two distinct axis directions act on the flexible wiring member 201, a problem such as disconnection does not arise, while the flexible wiring member 201 does not block the swing operation of the image pickup device 20 performed by the shake correction unit.

In this configuration, in the flexible wiring board, a plurality of conductors are preferably aligned and arranged at predetermined intervals in the transverse direction, while the upper and lower surfaces are sealed with insulating films. Such a flexible wiring board has a thin belt shape, and hence is suitable for compact built-in. Nevertheless, the deformation direction becomes restrictive. That is, the flexible wiring board is easily bent or deformed in such a manner that the belt-shaped plane serves as the bending surface, but is hardly deformed in a direction perpendicular to this bending.

However, in the invention, as shown in FIG. 2, the space part G is set up between the shake correction unit 2 and the control board 6, so that the flexible wiring member 201 is accommodated in the space part G in a bent state. Thus, when the image pickup device 20 is swung in the yaw direction y as shown in FIG. 3(a), the flexible wiring member 201 follows and deforms in the easily bending direction. Further, when the image pickup device 20 is swung in the pitch direction p as shown in FIG. 3(b), the flexible wiring member 201 follows and deforms in a twisted manner (there is a degree of margin of follow-up and deformation). Thus, such deformation in the two distinct axis directions such as the yaw direction y and the pitch direction p which are perpendicular to each other can be followed up freely.

In the above-mentioned configuration of claim 1 or 2, preferably: a mount section to which a taking lens is attached is provided on the front side; a rectangular-tube shaped frame in the inside of which a retractable-type reflecting plate for reflecting object light is arranged is provided; the shake correction unit is attached on the rear side of the frame; and the flexible wiring member is accommodated in a planar space in alignment with a side wall part of the frame.

This configuration is described below with reference to FIG. 2. A shake correction unit 2 is attached to the rear face of a rectangular-tube shaped frame 115 (a retractable-type reflecting plate is omitted in the figure) provided, in the front, with a mount section 13 to which a taking lens 12 is attached. A planar space part G is set up in alignment with a side wall part 1155 of the frame 115, so that the flexible wiring member 201 is bent and arranged in the planar space part G. According to this configuration, since the planar space is prepared in alignment with the side wall part 1155 of the rectangular-tube shaped frame 115, the space where the flexible wiring member 201 is to be bent is easily ensured. In particular, when the flexible wiring board having a belt shape is used, a space where the bending deformation and twist deformation are performed is efficiently ensured advantageously.

In this configuration, in the shake correction unit, a flexible member guide section preferably extends for guiding the flexible wiring member to the space part. FIG. 2 shows an example of this flexible member guide section where an extending section having a downward arc surface indicated by numeral 20E is provided in an edge of the shake correction unit 2. According to this configuration, even when the shake correction unit 2 swings so that the flexible wiring member 201 follows this swing and thereby undergoes bending deformation or twist deformation, the flexible wiring member 201 does not suffer damage.

Next, the present embodiment is described below in detail with reference to FIG. 3.

(Description of Camera Appearance Structure)

Figure 4:
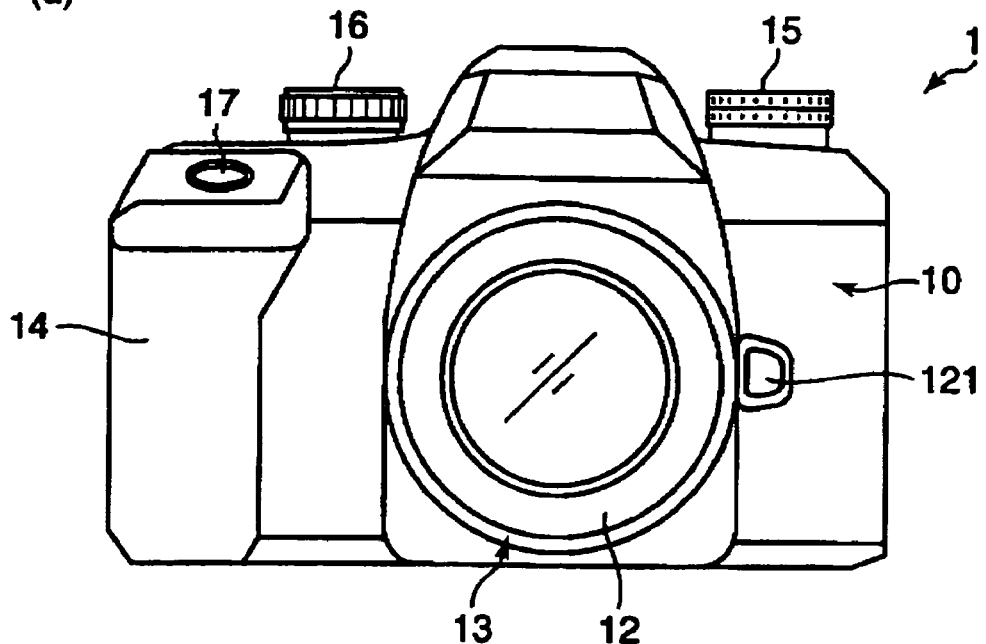
FIG. 4 is a diagram describing the appearance structure of a digital camera according to an embodiment of a camera with shake correction mechanism of the invention.
Figure 4:
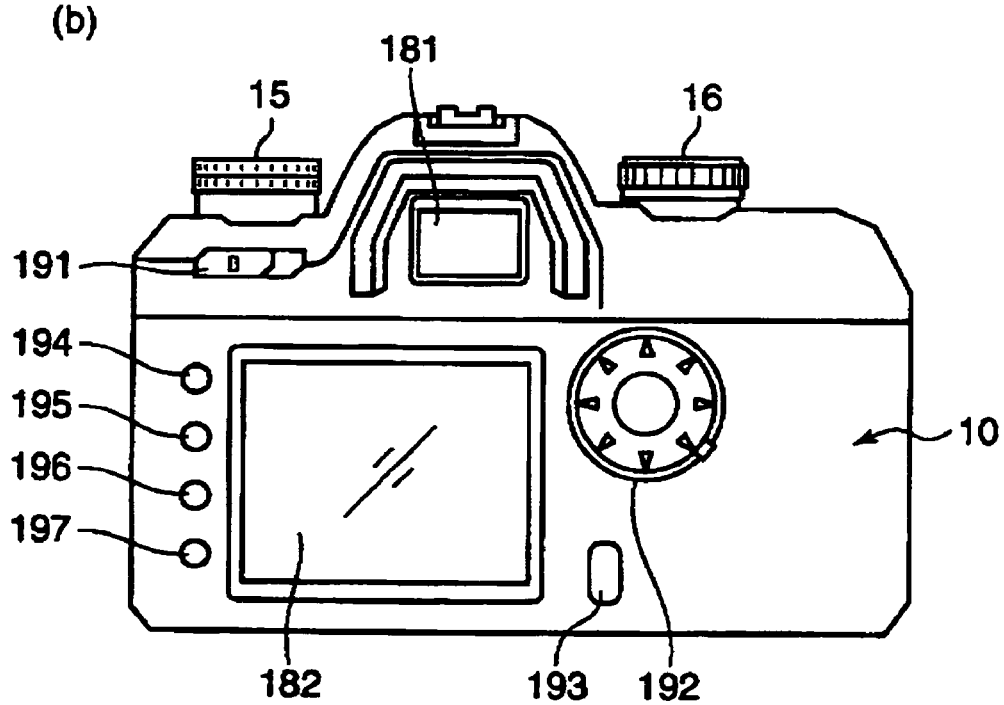

FIG. 4 is a diagram describing the appearance structure of a digital camera 1 according to an embodiment of a camera with shake correction mechanism of the invention. FIG. 4(a) is an external front view of the digital camera 1, while FIG. 4(b) is an external rear view of the digital camera 1. As shown in FIG. 4(a), this digital camera 1 is a single lens reflex type digital still camera comprising: a camera body 10; and a taking lens 12 (interchangeable lens) attached to an approximate center of the front face of the camera body 10 in an attachable and detachable (interchangeable) manner.

In FIG. 4(a), the camera body 10 comprises: a mount section 13 which is located in an approximate center of the front face, and to which the taking lens 12 is attached; a grip section 14 protruding in a front left end part and thereby permitting a user to grip (retain) the camera reliably by one hand (or two hands); a control value setting dial 15 located in a front upper right part and setting a control value; a mode setting dial 16 located in a front upper left part and switching a photographing mode; and a release button 17 located in an upper surface of the grip section 14 and instructing the start and/or stop of a photographing operation (exposure).

The taking lens 12 serves as a lens window for acquiring light (an optical image) from a photographic object, and further constitutes a taking lens system (such as a zoom lens block and a fixed lens block arranged in series along the optical axis) for leading the light to an image pickup device 20 and a finder section 7 arranged inside the camera body 10 as described later. In the taking lens 12, each lens position can be moved manually or automatically so that the focusing can be adjusted.

Provided near the mount section 13 are: an attaching and detaching button 121 for attaching and detaching the taking lens 12; a plurality of electrical contacts for establishing electrical connection to the attached interchangeable lens 12 (omitted in the figure); and a plurality of couplers for establishing mechanical connection (omitted in the figure). These electrical contacts are used for transmitting the characteristic information of the lens (information such as the open F value and the focal length) from a lens ROM (read-only memory) built in the taking lens 12 to a system control section in the camera body 10, or alternatively transmitting to the system control section the information on the position of the focus lens or the position of the zoom lens in the taking lens 12. The coupler transmits a driving force of the focus lens driving motor provided in the camera body 10 to each lens in the taking lens 12.

In FIG. 4(*a*), a battery accommodating chamber and a card accommodating chamber are provided inside the grip section 14. The battery accommodating chamber accommodates, for example, a predetermined number of dry batteries of AA size as a power supply of the camera. The card accommodating chamber accommodates a recording medium such as a memory card for recording the image data of a taken image, in an attachable and detachable manner.

The mode setting dial 16 is used for setting various photographing modes including: an automatic exposure (AE) control mode or an automatic focusing (AF) control mode; a static image photographing mode for taking a still image or a video shooting mode for shooting a video (continuous photographing mode); and a flash mode.

The release button 17 is a push switch permitting: an operation where the switch is pushed halfway into a "half push state" and; an operation where the switch is pushed further into a "full push state". In the static image photographing mode, when the release button 17 is pushed halfway, a preparation operation (preparation operation such as the setup of an exposure control value and the focusing adjustment) is performed for taking a still image of a photographic object. When the release button 17 is fully pushed, a photographing operation (a series of operation including: exposure in a color image pickup device described later; predetermined image processing on the image signal acquired in the exposure; and data recording into a memory card) is performed. In the video shooting mode, when the release button 17 is fully pushed, a shooting operation (a series of operation similar to the above-mentioned one including: exposure in the color image pickup device; image processing on the image signal acquired in the exposure; and recording of the image-processed image data into the memory card) is started. Then, when the release button 17 is fully pushed again, the shooting operation is stopped.

In FIG. 4(*b*), a finder window 181 (ocular section) is provided in an approximate upper center of the rear face of the camera body 10. An object image is led from the interchangeable lens 12 to the finder window 181. Thus, a user (photographing person) looks through this finder window 181, so that the photographic object can be recognized visually. An external display section 182 (LCD; liquid crystal display monitor) is provided in an approximate center of the rear face of the camera body 10. In the present embodiment, the external display section 182 is composed of a color liquid crystal display device having a pixel number of 400 (X direction)× 300 (Y direction)=120000, and displays the above-mentioned video image. The external display section 182 also displays a menu screen for setting up a mode concerning the AE control or the AF control, a mode concerning the photographing scene, a photographing condition, and the like. Further, in the reproduction mode, the external display section 182 reproduces and displays a taken image recorded in the memory card.

A power switch 191 is provided on the upper left of the external display section 182. The power switch 191 is composed, for example, of a two-position slide switch. When the contact is set into an "OFF" position on the left, the power goes OFF. When the contact is set into an "ON" position on the right, the power goes ON. On the right-hand side of the external display section 182, a direction selection key 192 and a camera shake correction switch 193 are provided. The direction selection key 192 has a circular manual operation button. In this manual operation button, detected are: push operations in the four directions of up, down, right, and left; and push operations in the four directions of upper right, upper left, lower right, and lower left. The direction selection key 192 is multi-functionalized. That is, for example, the direction selection key 192 serves as an operation switch for changing an item selected in the menu screen for photographing scene setup displayed on the external display section 182. The direction selection key 192 serves also as an operation switch for changing a frame of reproduction target selected in an index screen where a plurality of thumbnail images are displayed in an array format. Further, the direction selection key 192 can serve also as a zoom switch for changing the focal length of the zoom lens of the interchangeable lens 12.

The camera shake correction switch 193 is used for setting up a shake correction mode for permitting reliable photographing in the case of possible occurrence of a "shake" such as a camera shake in the situation of hand-held photographing, telescope photographing, or dark-site photographing (requiring a long time exposure). This camera shake correction switch 193 may be composed of a two-position slide switch similar to the power switch 191.

On the left of the external display section 182, switches are provided that is used for performing operations concerning the display and the display contents of the external display section 182. These switches include: a cancellation switch 194, a confirmation switch 195, a menu display switch 196, and an external display changing switch 197. The cancellation switch 194 is a switch for canceling the contents selected in the menu screen. The confirmation switch 195 is a switch for confirming the contents selected in the menu screen. The menu display switch 196 is a switch for displaying the menu screen on the external display section 182 or for switching the contents (such as a photographing scene setting screen and an exposure control mode setting screen) of the menu screen. The menu screen is switched at each press of the menu display switch 196. The external display changing switch 197 is a switch for turning ON the display of the external display section 182 or for turning OFF the display. The display and the non-display of the external display section 182 are switched at each press of the external display changing switch 197. In addition to these switches, various switches such as a zoom switch, an exposure correction switch, and an AE lock switch each implemented by a push type switch and a dial type switch may be provided in an appropriate place of the camera body 10.

(General Description of Camera Internal Configuration)

Next, the internal configuration of the digital camera 1 is described below.

Figure 5:
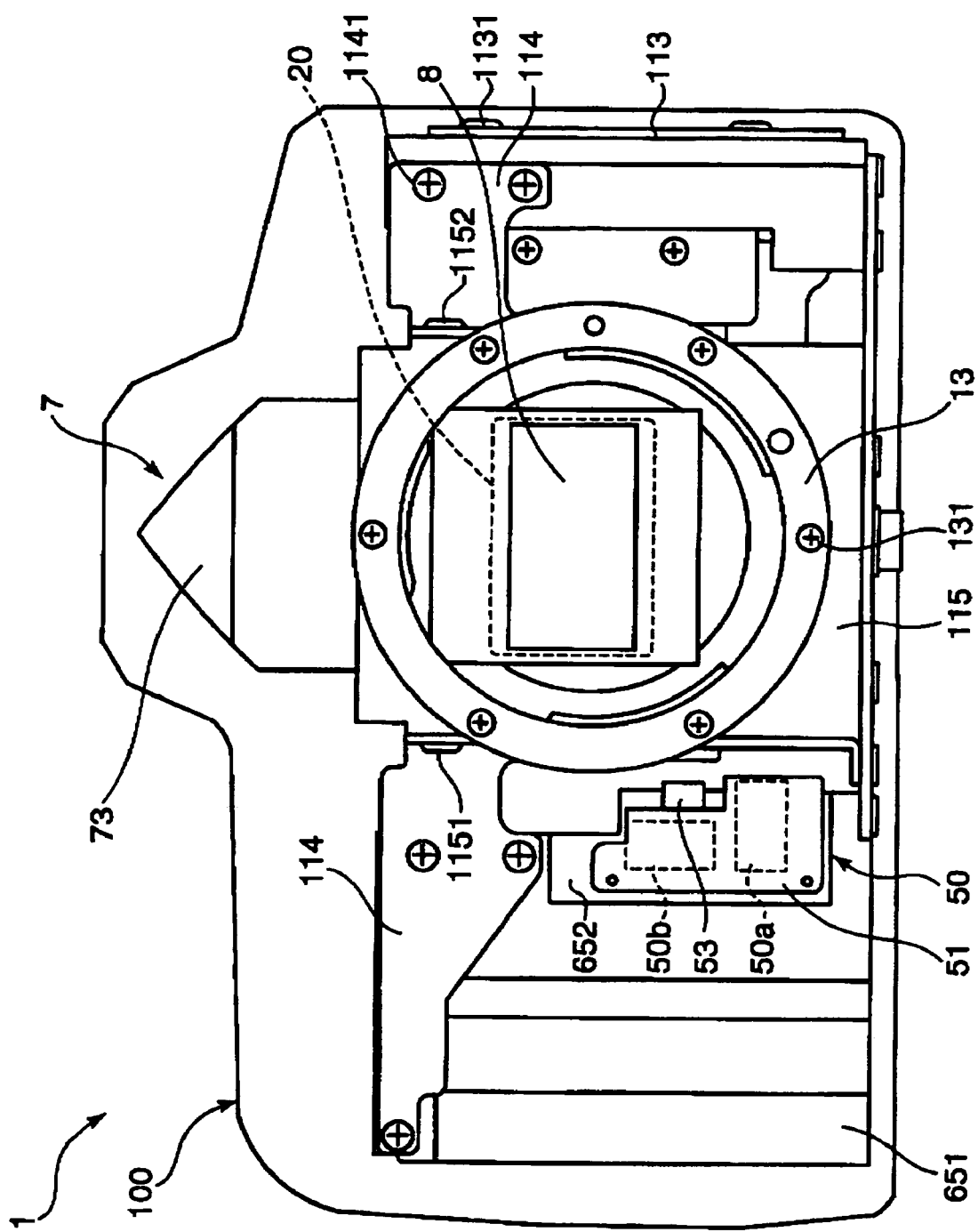
FIG. 5 is a front perspective view of a digital camera according to an embodiment.
Figure 6:
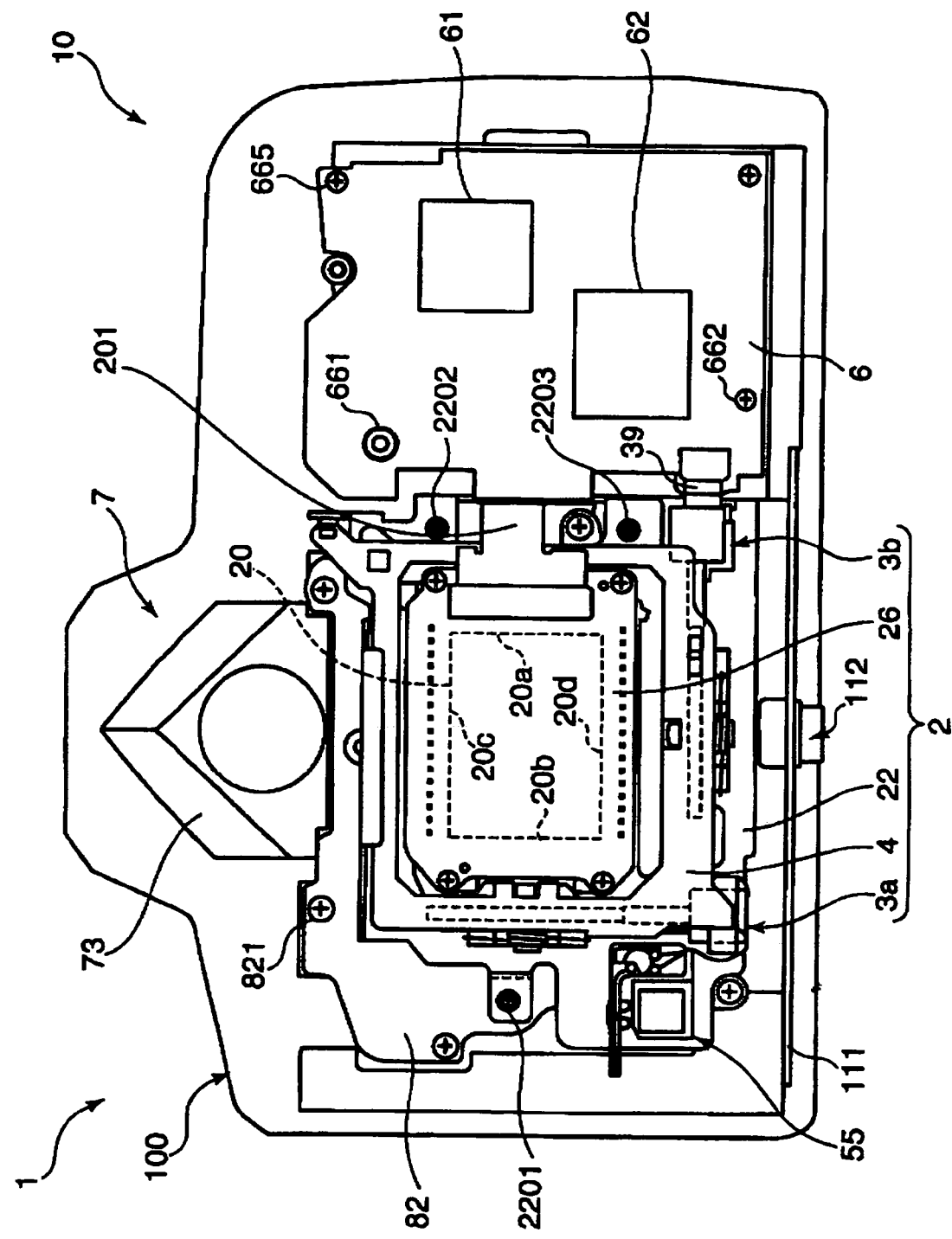
FIG. 6 is a rear perspective view of a digital camera according to an embodiment.
Figure 7:
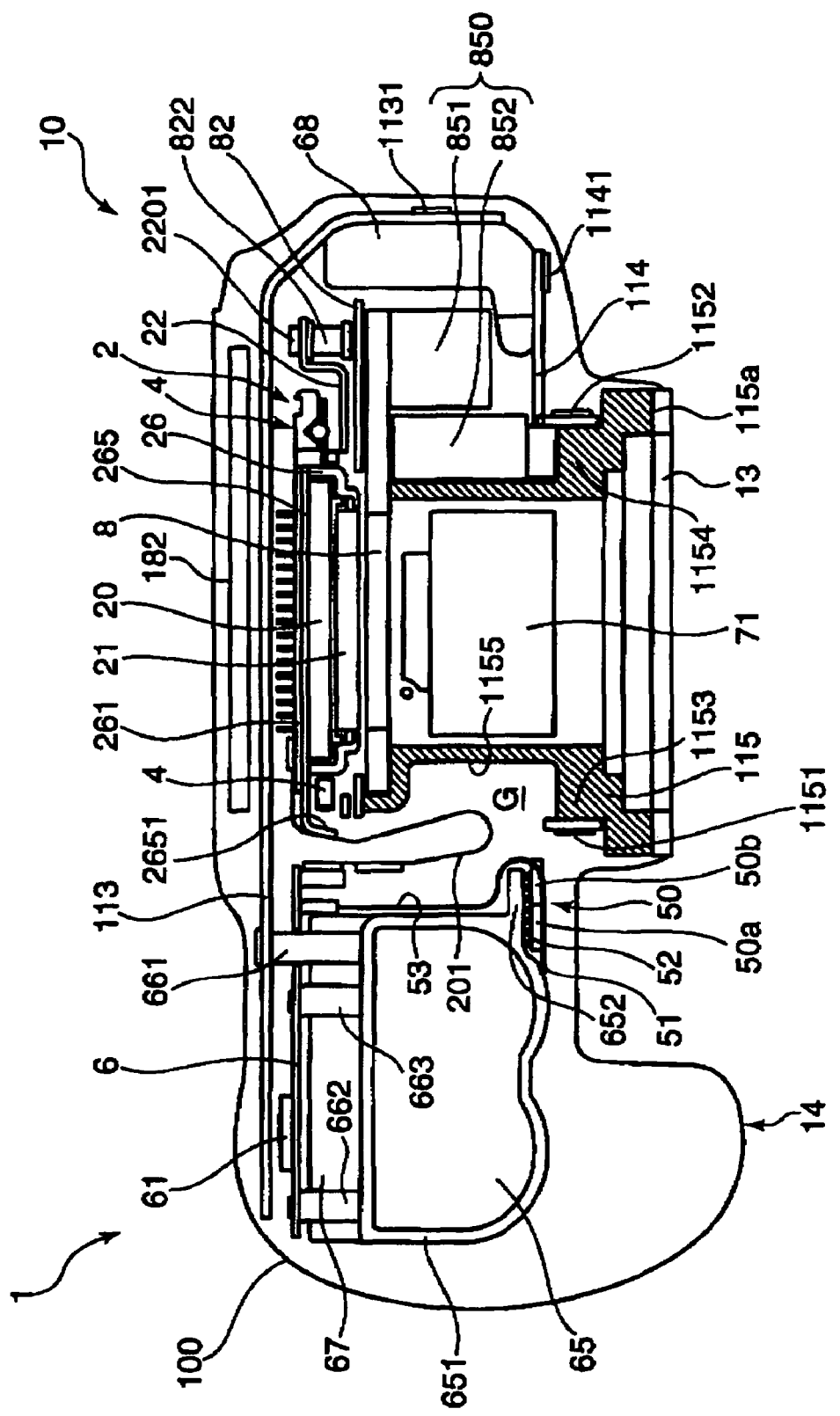
FIG. 7 is a top sectional view of a digital camera according to an embodiment.
Figure 8:
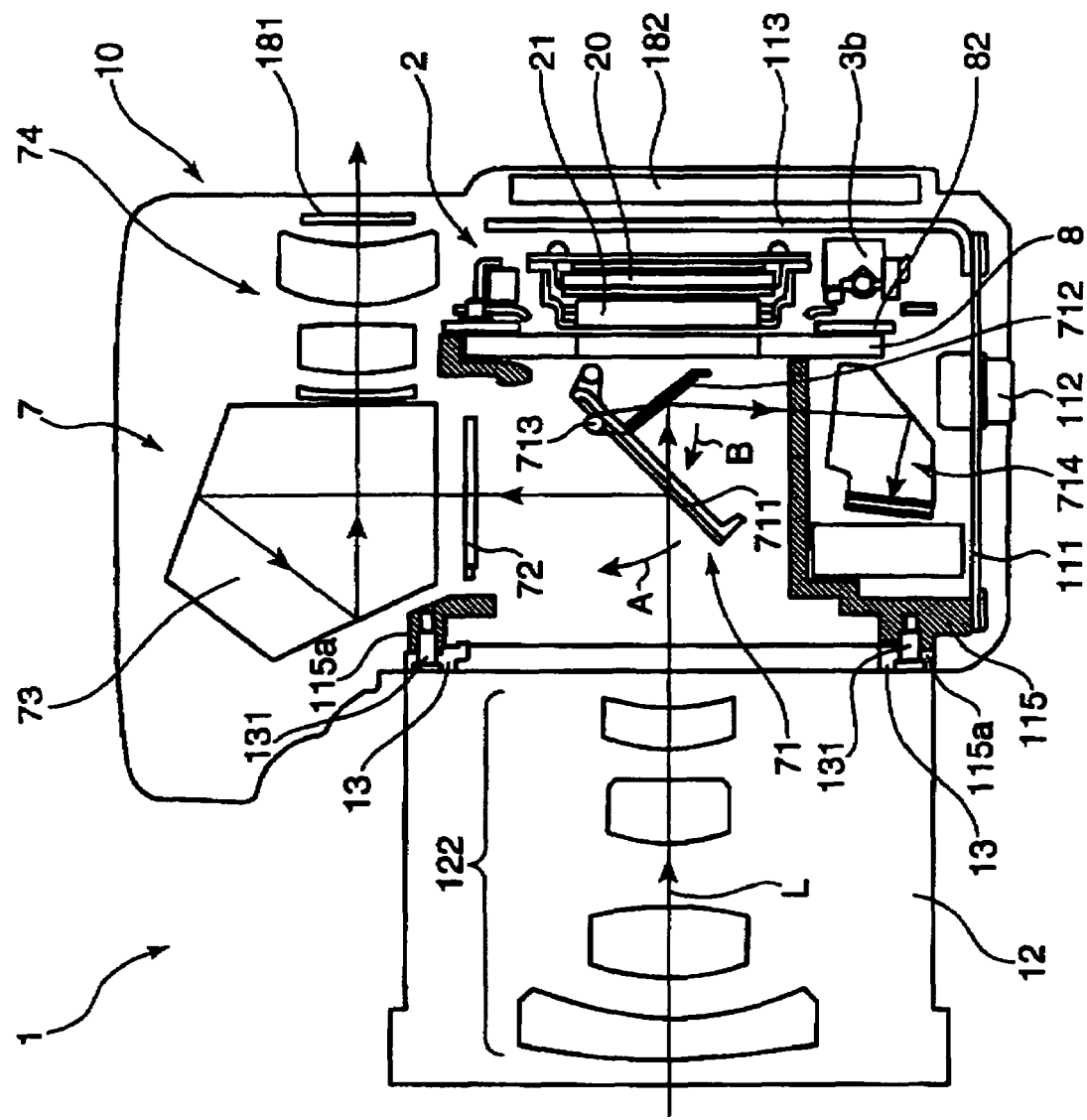
FIG. 8 is a side sectional view of a digital camera according to an embodiment.

FIG. 5 is a front perspective view of a digital camera 1. FIG. 6 is a rear perspective view. FIG. 7 is a top sectional view. FIG. 8 is a side sectional view. Here, FIGS. 5-7 are a perspective view and sectional views showing the state that the taking lens 12 is removed. In the digital camera 1, the interchangeable lens 12 is attached to the camera body 10 as shown in FIG. 8. In the inside of the body casing 100 of the camera body 10, an image pickup device 20 having a rectangular shape for picking up object light, a shake correction unit 2 provided with a driving section (actuators 3*a* and 3*b*) for exerting a swing force for swinging the image pickup device 20 in a direction perpendicular to the optical axis, a shake detection section 50 for detecting a shake exerted to the camera body 10, a position detection sensor section 55, a control board 6 on which electronic components such as an ASIC 61 containing various circuits for image processing and a drive control circuit 62 of the driving section are mounted, a battery chamber 65, a memory card accommodating section 67, a connector section 68, a finder section 7 for checking the field of view, a mirror section 71, a frame 115 for accommodating the mirror section, a shutter 8, and the like are accommodated in a manner fixed and integrated by a bottom chassis 111, a side chassis 113, a front chassis 114, and the like (However, the image pickup device 20 and a part of the correction unit 2 are swung as described later, and hence not fixed rigid).

As shown in FIGS. 5 and 8, the image pickup device 20 is arranged at a position inside the camera body 10 opposing the taking lens 12, that is, at an appropriate position inside the camera body 10 on the optical axis L (see FIG. 8) of a lens group 122 provided in the taking lens 12 when the taking lens 12 is attached to the camera body 10, in a direction perpendicular to the optical axis L.

The image pickup device 20 detects the photographic object luminance (picks up the object light). That is, in response to the quantity of light of the photographic object optical image formed by the taking lens 12, the image pickup device 20 performs photoelectric conversion into image signals of R, G, and B components, and then outputs the signals to the ASIC 61 on the control board 6. Specifically, the image pickup device 20 is a single plate type color area sensor of the so called Bayer method which has a rectangular shape (a rectangular shape is not indispensable), and in which color filters of R (red), G (green), and B (blue) are adhered in a checkered pattern onto the surface of each CCD element of the area sensor where CCD (Charge Coupled Device) elements are arranged in two dimensions. This color image pickup device 20 has 1600 (X direction)×1200 (Y direction) =1920000 pixels. The image pickup device 20 may be a CCD image sensor, a CMOS image sensor, a VMIS image sensor, or the like. However, in the present embodiment, a CCD image sensor is adopted.

When a shake such as a shake in a user's hand is exerted to the camera body 10 so that a deviation arises in the optical axis L, the shake correction unit 2 moves (swings) the image pickup device 20 appropriately in accordance with the shake, and thereby corrects the deviation in the optical axis L. In a general view, the shake correction unit 2 comprises a shake base plate 22, an image pickup device holder 26, a pitch direction actuator 3a and a yaw direction actuator 3b (a driving section), a slider 4 a position detection sensor section 55. The configuration of the shake correction unit 2 is described later in detail.

The control board 6 is arranged adjacent to the shake correction unit 2 in a direction of almost the same plane (see FIGS. 6 and 7). In the present embodiment, the control board 6 is attached by the threaded sections 662, 663 in a manner mounted on a battery holder 651 constituting the battery chamber 65 fixed to the side chassis 113 by a connection section 661. The control board 6 and the image pickup device 20 are electrically interconnected through the flexible wiring board (flexible wiring member) 201. Further, the control board 6 is electrically connected to the pitch direction actuator 3a, the yaw direction actuator 3b, and the position detection sensor section 55 through the second flexible wiring board 39.

Here, each of the flexible wiring board 201 and the second flexible wiring board 39 described above is a belt-shaped wiring member in which a plurality of conductors are aligned and arranged at predetermined intervals in the transverse direction, while the upper and lower surfaces are sealed with insulating films. These flexible wiring boards are arranged in the wiring appropriately in such a manner that the wider surface is curved. In particular, the flexible wiring board 201 is arranged in such a manner that predetermined bending is imparted such as to treat the swing of the shake correction unit 2. Here, in place of such a belt-shaped flexible wiring board, a wiring member may be employed that has the shape of a harness where round wires are bundled.

The battery holder 651 is arranged in a side part on the grip section 14 side of the camera body 10. The battery holder 651 is composed of cast resin such as plastics. In the battery chamber 65, a predetermined number of dry batteries of AA size or the like are accommodated as the operation power source of the digital camera 1. A card chamber 67 is provided in a rear part of the battery holder 651. In the card chamber 67, a memory card or the like for recording the image data of a taken image can be accommodated in an attachable and detachable manner.

The shake detecting section 50 comprises a pitch direction gyroscope 50a and a yaw direction gyroscope 50b, a gyroscope board 51, a shock absorbing material 52, and a flexible wiring board 53 for gyroscopes. The pitch direction gyroscope 50a and the yaw direction gyroscope 50b detect the angular velocity of a shake when a measuring object (the camera body 10, in the present embodiment) is rotated by the shake. This gyroscope may be, for example, of a type in which a voltage is applied to a piezoelectric element and thereby bringing the element into a vibrational state, while a distortion resulting from the Coriolis force generated when the angular velocity of a rotation is exerted on the piezoelectric element is picked up as an electric signal, so that the angular velocity is detected.

The pitch direction gyroscope 50a and the yaw direction gyroscope 50b are mounted on the gyroscope board 51, while the gyroscope side is attached via the shock absorbing material 52 to a plate shape gyroscope attaching section 652 provided in a side wall of the battery holder 651. The shock absorbing material 52 prevents that the gyroscope detects an erroneous vibration which could be caused if the operation vibration of the mirror section 71 were transmitted. The shock absorbing material 52 may be, for example, an isobutylene isoprene rubber sheet material having an adhesive layer on each side. The flexible wiring board 53 for gyroscopes electrically connects the pitch direction gyroscope 50a and the yaw direction gyroscope 50b to the control board 6.

The connector section 68 is arranged in a side part of the opposite side of the battery holder 651. The connector section 68 is composed of a resin cast provided with housings for a remote terminal, a USB terminal, or a jack of an AC power supply. The connector section 68 is fixed to the side chassis 113 with a screw 1131, and to the front chassis 114 with a screw 1141.

In an approximate center of the camera body 10, the frame 115 (front frame) is arranged in a manner inserted between the battery holder 651 and the connector section 68. The frame 115 is a rectangular tube member having an opening in the upper face opposing the finder section 7, and having a rectangular shaped viewed from the front side. Further, the frame 115 is a rigid body having sufficient strength against a strain or the like. In the front face of the frame 115, a cylindrical mounting receptacle section 115a is provided that is formed in accordance with the shape of the mount section 13. The mount section 13 is fit in to a mounting receptacle section 115a, while the mount section 13 is fixed with a plurality of screws 131. In fixing sections 1153 and 1154 each provided in a side part near the mounting receptacle section 115a, the frame 115 is fixed by the bent part of the front chassis 114 using screws 1151 and 1152 (see FIGS. 5 and 7)

On the optical axis L shown in FIG. 8, a mirror section 71 (reflecting plate) is arranged at a position appropriate for reflecting the object light toward the finder section 7 (finder optical system). The object light having passed through the taking lens 12 is reflected upward by the mirror section 71

(main mirror 711 described later), and then image-formed on the reticle 72 (focusing glass). A part of the object light having passed through the taking lens 12 is transmitted through the mirror section 71. The mirror section 71 is arranged in the above-mentioned frame 115, while the mirror section 71 is retained by the frame 115 by means of a support mechanism omitted in the figure.

The mirror section 71 comprises a main mirror 711 and a sub-mirror 712. On the rear side of the main mirror 711, the sub-mirror 712 is provided in a rotatable manner (retractable type) such as to be capable of falling toward the main mirror 711 rear face. A part of the object light having been transmitted through the main mirror 711 is reflected by the sub-mirror 712. Then, the reflected object light enters into the focus detection section 714. The focus detection section 714 is a so-called AF sensor composed of a distance measuring element or the like for detecting the focusing information of the photographic object.

The above-mentioned mirror section 71 is a so-called quick return mirror. At the time of exposure, the mirror jumps upward as indicated by an arrow A around a revolving shaft 713 serving as a pivot, and then stops at a position under the reticle 72. At that time, the sub-mirror 712 rotates in a direction indicated by an arrow B relative to the rear face of the main mirror 711 around the revolving shaft 713 serving as a pivot. When the above-mentioned mirror section 711 stops at the position under the reticle 72, the sub-mirror 712 goes into a folded state almost in parallel to the main mirror 711. Thus, the object light from the imaging lens 12 reaches the image pickup device 20 without being interrupted by the mirror section 71, so that exposure is performed in the image pickup device 20. On completion of the exposure, the mirror section 71 returns to the original position (position shown in FIG. 8).

The finder section 7 is arranged on top of the frame 115. The finder section 7 comprises a pentaprism 73, an ocular lens 74, and the above-mentioned finder window 181. The pentaprism 73 is a prism having a cross section of the shape of a pentagon, and generates an erect image from the photographic object optical image entered from the underside by inverting the top and bottom and the right and left of the image by means of internal reflection. The ocular lens 74 leads the object image converted into the erect image by the pentaprism 73, to the outside of the finder window 181. By virtue of this configuration, the finder section 7 serves as an optical finder at the time of photographing standby.

Immediately before the image pickup device 20 in the optical axis direction, a low pass filter 21 (optical filter) is arranged so as to prevent the occurrence of false color or color moiré. The low pass filter 21 is retained together with the image pickup device 20 by the image pickup device holder 26.

Immediately before the low pass filter 21, a shutter 8 serving as a mechanical shutter is arranged. The shutter 8 is controlled such as to be opened and closed at the time of exposure. In this example, a vertical running focal-plane shutter is adopted. The front side of the shutter 8 abuts against the rear end of the frame 115, while the rear side is pressed by a shutter pressing plate 82. The shutter pressing plate 82 is fixed to the frame 115 with screws 821 (see FIG. 6). As a result, the shutter 8 is supported by the frame 115 serving as a rigid body.

Behind the image pickup device 20, the above-mentioned external display section 182 is arranged in parallel to the image pickup device 20 plane in a manner arranging the side chassis 113 therebetween. On the other hand, a drive unit 850 for driving the mirror section 71 and the shutter 8 is arranged between the frame 115 and the connector section 68. Specifically, the drive unit 850 comprises: a shutter driving section 851 for opening and closing the shutter 8; and a mirror driving section 852 for driving the mirror section 71. However, the mirror driving section 852 has also the function of driving the shutter 8 partly.

When the above configuration is considered as a joining structure of these structures, the shutter 8 and the shake correction unit are first attached to the rear end side of the frame 115, and then connected to the front chassis 114 with the screws 1151 and 1152 on the front side (fixing sections 1153 and 1154) of the frame 115. Then, the connector section 68 is attached to the front chassis 114 with the screw 1141. As a result, the frame 115 is connected to the connector section 68 by the front chassis 114. Further, the battery holder 651 in which the connector section 68 and the control board 6 are integrated is also connected by the side chassis 113 via the screw 1131 and the connection section 661. Here, the frame 115 is connected to the connector section 68 by the bottom chassis 111 also. The bottom chassis 111 is provided with a threaded section 112 for tripod for attaching a tripod.

Since the joining structure having this structure is adopted, even when a vibration could be caused by the drive of the mirror section 71, the vibration is not directly transmitted to the shake detecting section 50 attached to the gyroscope attaching section 652 provided in the battery holder 651 (the vibration is damped in the course of bypassing the chassis). This minimizes the influence to the shake detection in the shake detecting section 50.

Further, since this joining structure is adopted, the predetermined space part G (see FIG. 7) is easily set up between the unit (structure) containing the frame 115 and the shake correction unit 2 and the unit (structure) containing the control board 6 and the battery holder 651. That is, since no joining structure section is provided between the frame 115 and the battery holder 651, and since the drive unit 850 is arranged on the connector section 68 side, the planar space is easily ensured in alignment with the side wall part 1155 of the frame 115 having a rectangular tube shape. Then, in the present embodiment, the planar space part G where the flexible wiring board 201 can be accommodated in a bent state is set up in the vicinity of the side wall part 1155, so that so that the flexible wiring member 201 is bent and arranged in the planar space part G. Thus, the flexible wiring board 201 can move and follow the swing operation in two dimensions performed by the image pickup device 20.

(General Schematic Description of Shake Correction Unit)

Next, the shake correction unit 2 according to the present embodiment is described below in detail.

Figure 9:
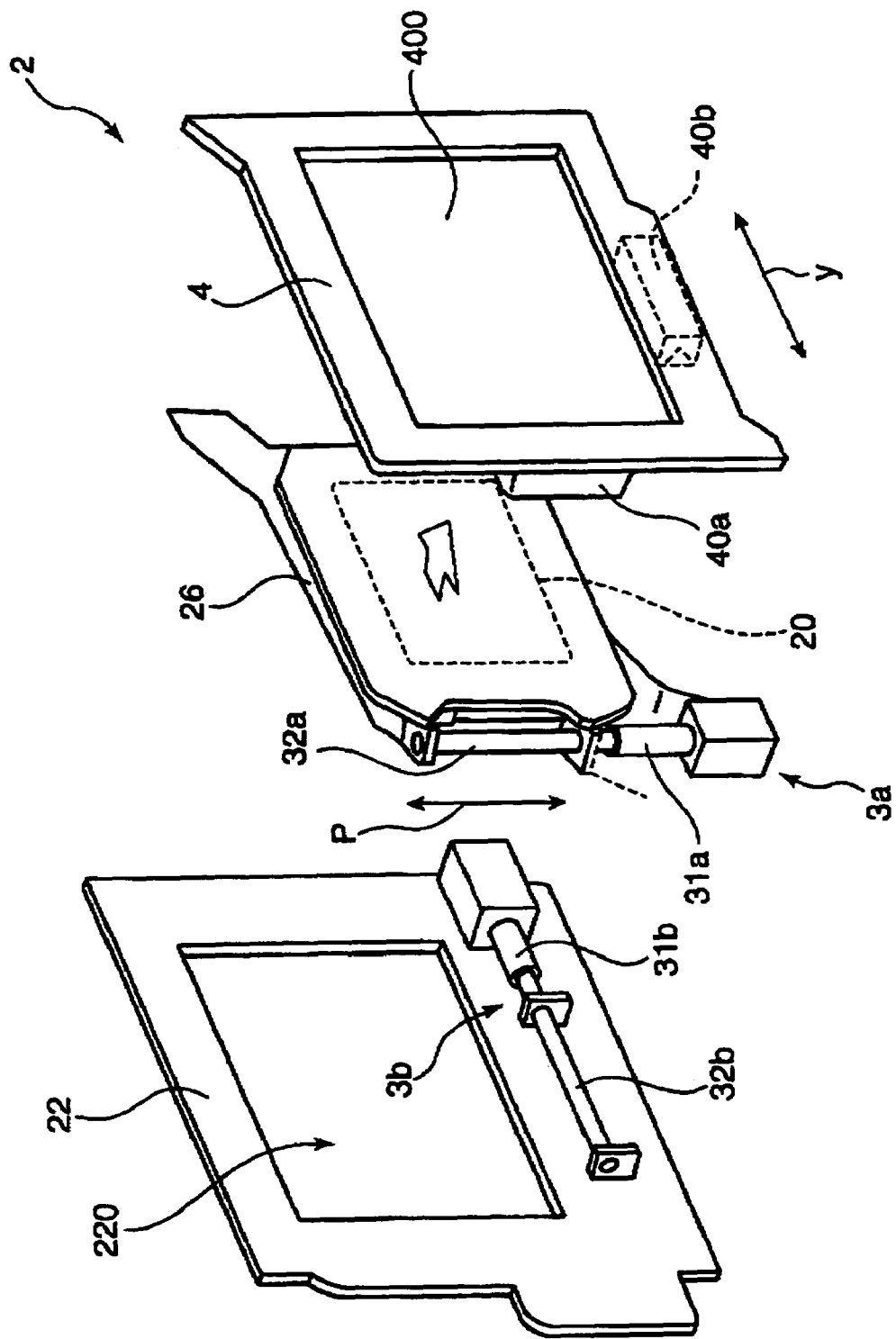
FIG. 9 is an exploded perspective view schematically showing the configuration of a shake correction unit built in a digital camera according to an embodiment.

FIG. 9 is an exploded perspective view schematically showing the configuration of the shake correction unit 2 (details are omitted in this schematic drawing). In a general view, the shake correction unit 2 comprises three board members consisting of the shake base plate 22, the image pickup device holder 26, and the slider 4. The shake base plate 22 serves as a base member (fixed board), while the image pickup device holder 26 and the slider 4 are stacked successively as a moving board.

As shown in FIG. 7 or 8, the image pickup device holder 26 serves as a moving board retaining the image pickup device 20 and the low pass filter 21. The shake base plate 22 serves as a fixed board for attaching the shake correction unit 2 to the camera body. The shake base plate 22 is provided with a window part 220 having a rectangular shape corresponding to the appearance shape (a rectangle) of the image pickup device 20 such that the object light should reach the image pickup device 20 via the shutter 8. The slider 4 serves as a moving board having a frame-like rectangular shape provided with a window part 400 approximately agreeing with the shape of the image pickup device 20.

In the image pickup device holder 26, a pitch direction actuator 3a (first driving section) is mounted in alignment with one side end of the image pickup device 20. The pitch direction actuator 3a is a piezoelectric actuator provided with a piezoelectric element 31a and a driving shaft 32a, as described later in detail. In one side end of the slider 4, a frictional coupling section 40a is provided that establishes frictional coupling with the driving shaft 32a. When the driving shaft 32a is driven by the piezoelectric element 31a, the image pickup device holder 26 is swung relative to the slider 4 in the direction (pitch direction) of an arrow p in the figure. That is, a swing force for swinging the image pickup device 20 in a first direction (pitch direction) perpendicular to the optical axis L of the digital camera 1 (see FIG. 8) is provided in a side end part (second side end part) of the image pickup device 20.

On the other hand, in the shake base plate 22 serving as the fixed board, a yaw direction actuator 3b (second driving section) is similarly mounted that comprises a piezoelectric element 31b and a driving shaft 32b. In another side end of the slider 4, a frictional coupling section 40b is provided that establishes frictional coupling with the driving shaft 32b. When the driving shaft 32b is driven by the piezoelectric element 31b, the slider 4 is swung relative to the shake base plate 22 in the direction (yaw direction) of an arrow y in the figure. That is, a swing force for swinging the image pickup device 20 in a second direction (yaw direction) perpendicular to the optical axis L of the digital camera 1 and further perpendicular to the first direction (pitch direction) is provided in a side end part (fourth side end part) of the image pickup device 20.

By virtue of this swing mechanism employing the pitch direction actuator 3a and the yaw direction actuator 3b, the image pickup device 20 can move freely in the pitch direction and the yaw direction. Thus, the image pickup device 20 can be swung in response to shake exerted to the camera body 10. When the shake detecting section 50 detects the amount of the shake so that according to this result, the pitch direction actuator 3a and the yaw direction actuator 3b are driven appropriately, desired shake correction is performed.

As for the arrangement of the pitch direction actuator 3a and the yaw direction actuator 3b, the arrangement relation described above in FIG. 3 is adopted. That is, as shown in FIG. 6, the pitch direction actuator 3a (first driving section) is arranged in the second side end 20b part opposing the first side end 20a of the approaching image pickup device 20 close to the adjacent part of the shake correction unit 2 and the control board 6 (that is, arranged in the side end 20b of the image pickup device 20 opposite to the side end 20a of the image pickup device 20 close to the adjacent part). Further, the yaw direction actuator 3b (second driving section) is arranged in the fourth side end 20d part opposing the third side end 20c of the image pickup device 20 close to the adjacent part of the shake correction unit 2 and the finder section 7 (that is, arranged in the side end 20d of the image pickup device 20 opposite to the side end 20c of the image pickup device 20 close to the adjacent part).

This avoids the necessity of ensuring the space for installing the actuator, in the part adjacent to the control board 6. Thus, the shake correction unit 2 and the control board 6 can be arranged closer to each other. This reduces the wiring path formed by the flexible wiring board 201. This reduces the influence of noise. Further, the necessity is also avoided that ensures the space for installing the actuator, in the part adjacent to the finder section 7. Thus, the shake correction unit 2 and the finder section 7 can be arranged closer to each other. This reduces the size in the height direction of the camera.

(Description of Each Component Member of Shake Correction Unit)

Figure 10:
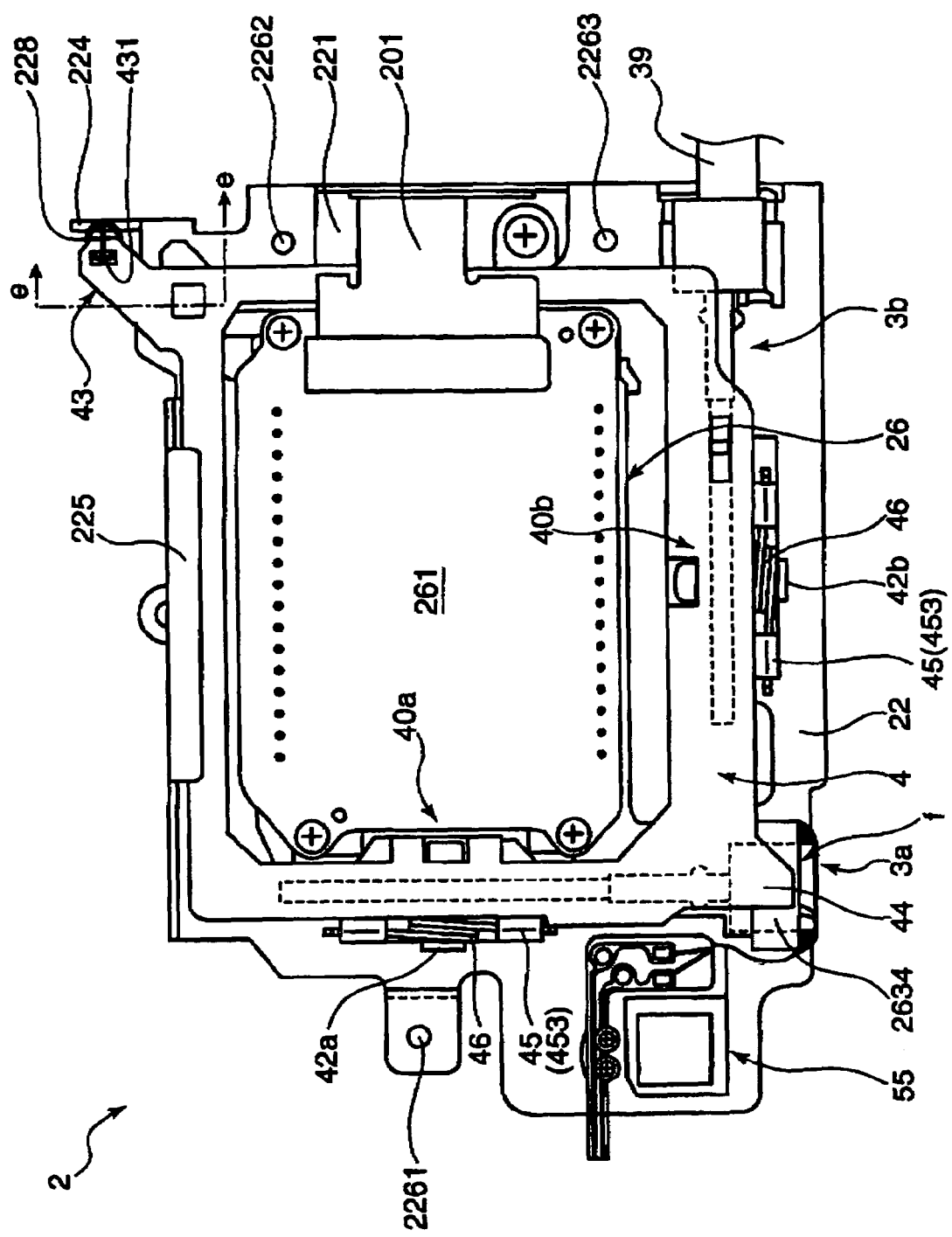
FIG. 10 is a plan view showing an attachment state of a shake correction unit.
Figure 11:
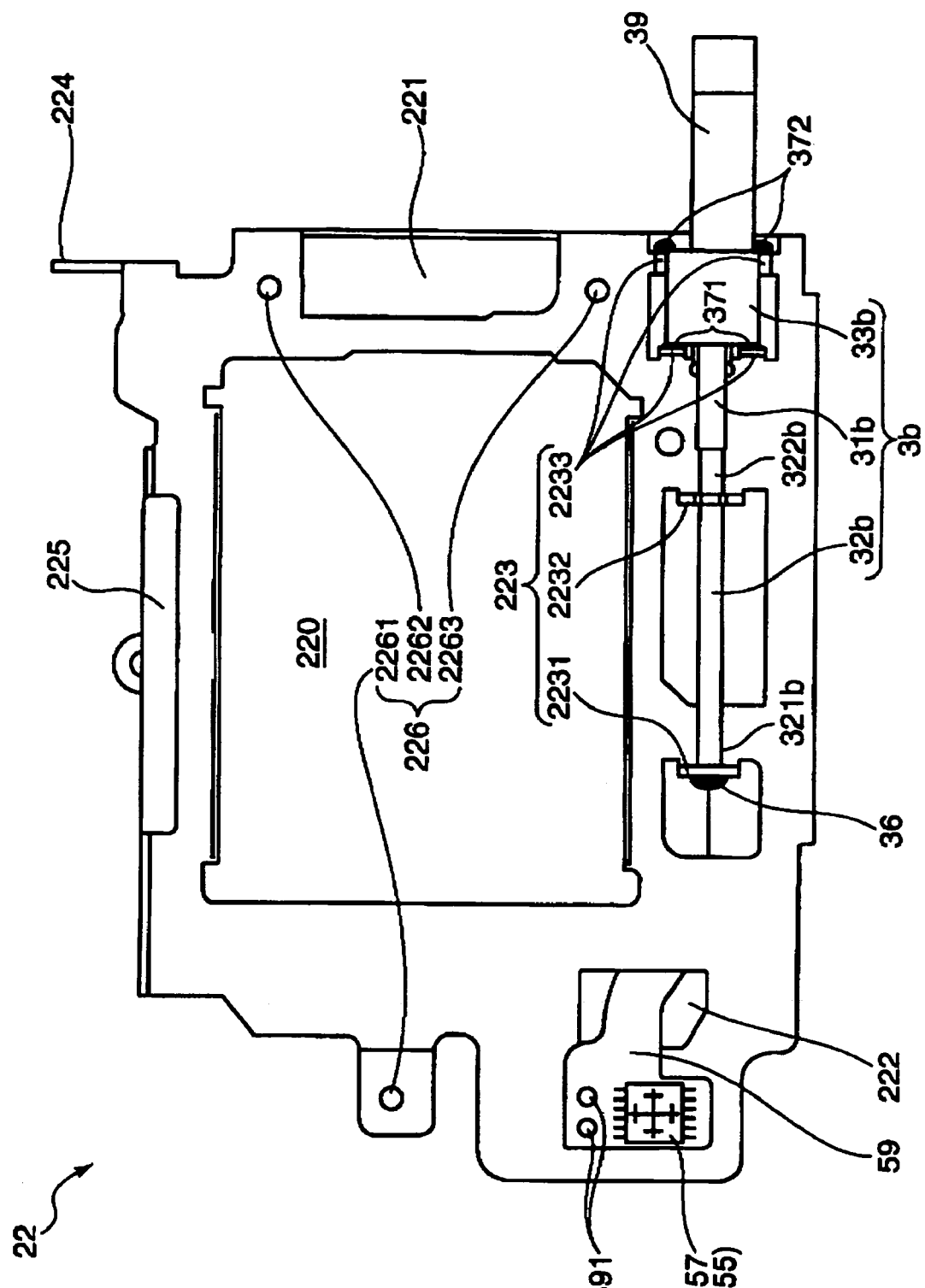
FIG. 11 is a plan view showing a shake base plate serving as a component member of a shake correction unit.
Figure 12:
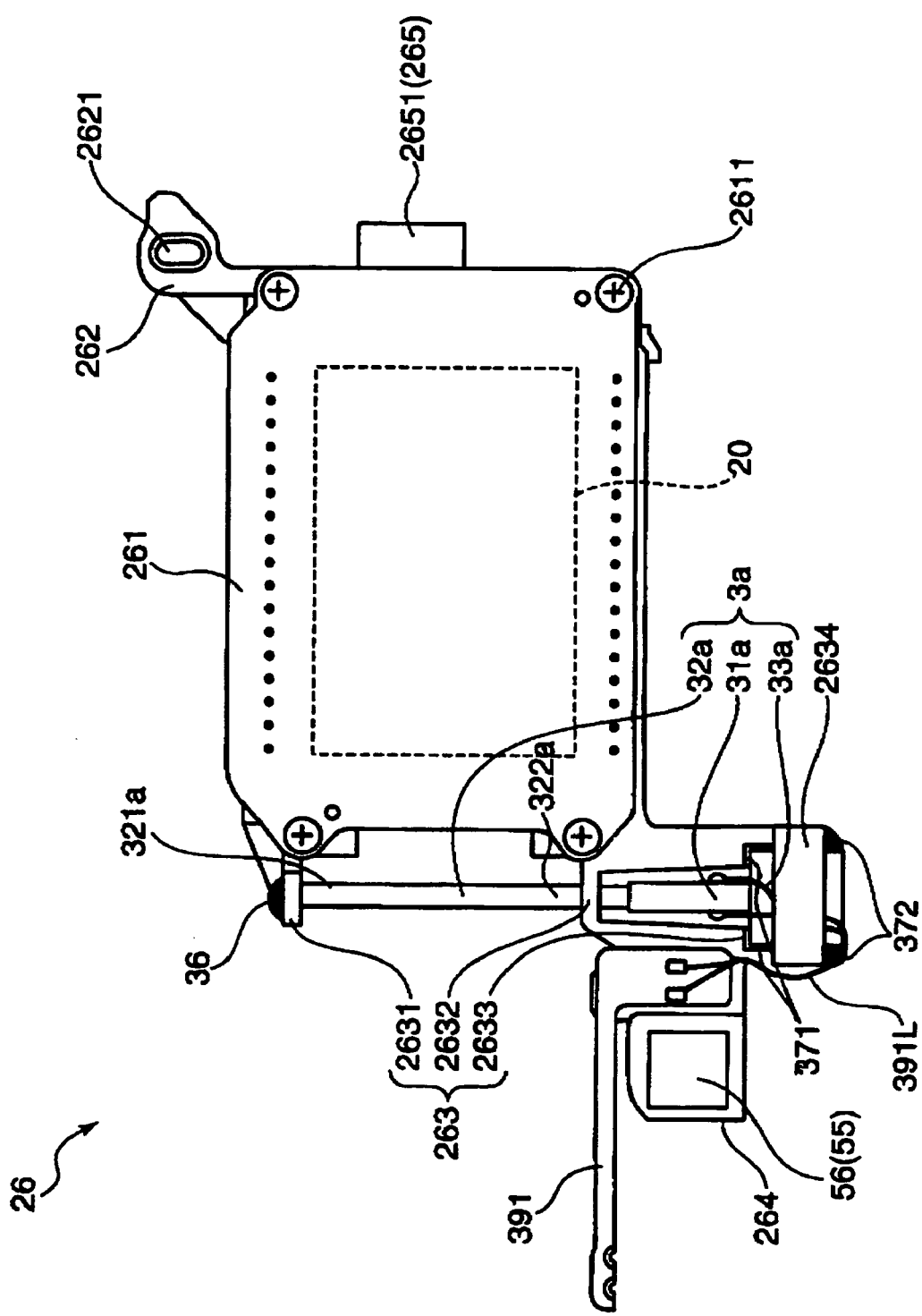
FIG. 12 is a plan view showing an image pickup device holder serving as a component member of a shake correction unit.
Figure 13:
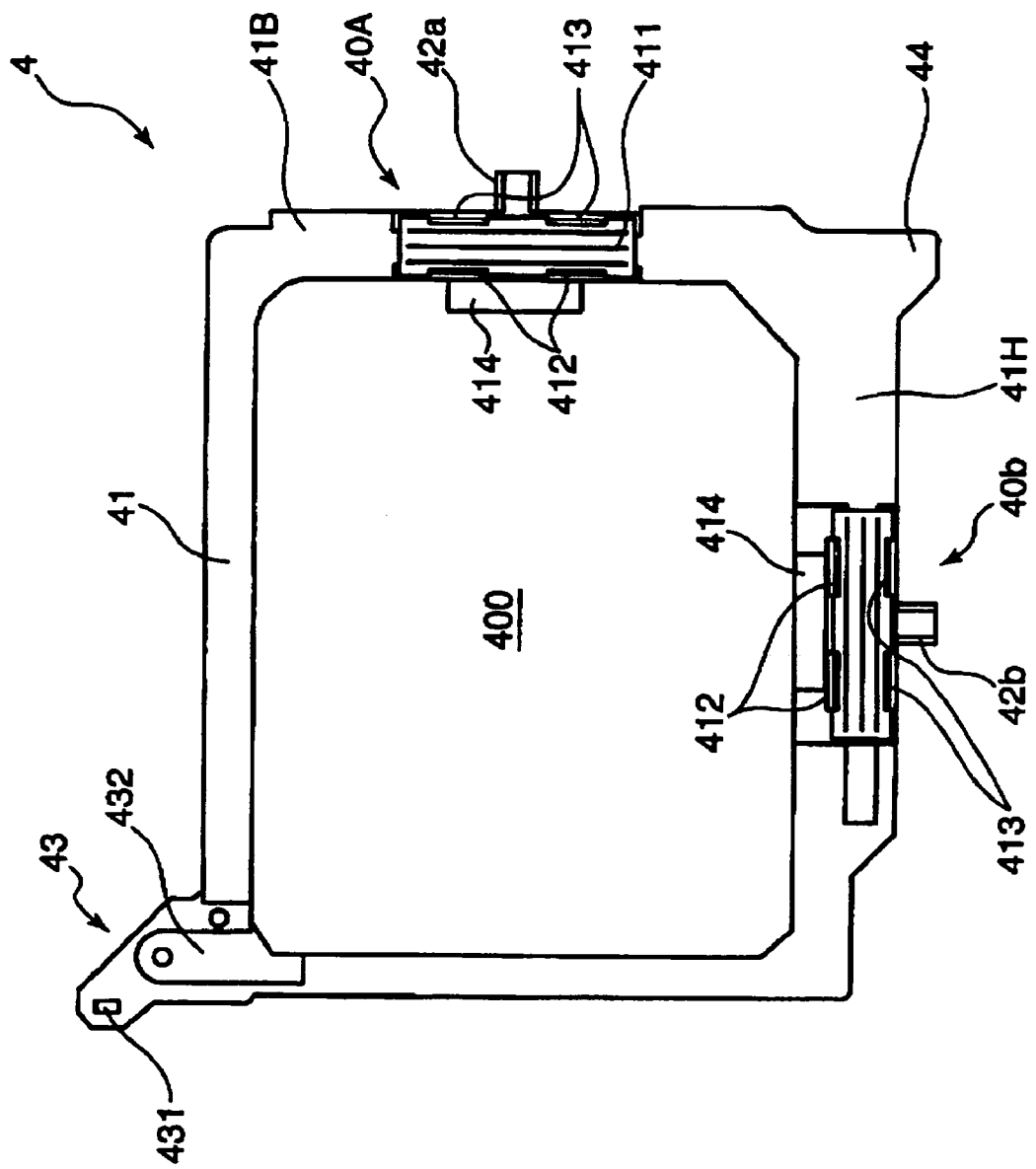
FIG. 13 is a plan view showing a slider serving as a component member of a shake correction unit.

Next, each component member of the shake correction unit 2 is described below. FIG. 10 is a plan view showing the state that the three board members consisting of the shake base plate 22, the image pickup device holder 26, and slider 4 shown in FIG. 9 are assembled. FIG. 11 is a plan view of the shake base plate 22. FIG. 12 is a plan view of the image pickup device holder 26. FIG. 13 is a plan view of the slider 4.

<<On Shake Base Plate>>

In FIG. 11, in addition to the above-mentioned window part 220, the shake base plate 22 comprises: a first wiring window section 221 through which the flexible wiring board 201 passes; a second wiring window 222 through which a flexible wiring board 59 for a Hall sensor 57 for position detection described later passes; an actuator attaching section 223 for fixing the yaw direction actuator 3b; a first connection spring attaching section 224; a stopper frame 225 for preventing the slider 4 from running out when a shock or the like is exerted; and screw holes 226 through which adjustment screws 2201-2203 (see FIG. 6 and FIG. 23 described later) for tilt adjustment pass, and which serve as a fixing section for fixing the shake correction unit 2 to the camera body.

The yaw direction actuator 3b attached to the actuator attaching section 223 comprises a piezoelectric element 31b, a driving shaft 32b, and a weight member 33b having a rectangular shape. The actuator attaching section 223 comprises: a tip attaching section 2231 composed of a bent piece provided with a through hole for retaining the tip part 321b of the driving shaft 32b; an intermediate attaching section 2232 composed of a bent piece provided with a through hole for retaining the vicinity of the pedestal part 322b of the driving shaft 32b; and a weight attaching section 2233 composed of four bent pieces standing and allowing the weight member 33b to be fit in. The tip part 321b of the driving shaft 32b is fixed to the tip attaching section 2231 with elastic adhesive 36. Further, on the front side (driving shaft 32b side), the weight member 33b is fixed to the two weight attaching sections 2233 on the front side with elastic adhesive 371, while on the rear side, the weight member 33b is fixed to the two weight attaching sections 2233 on the rear side with elastic adhesive 372.

Figure 14:
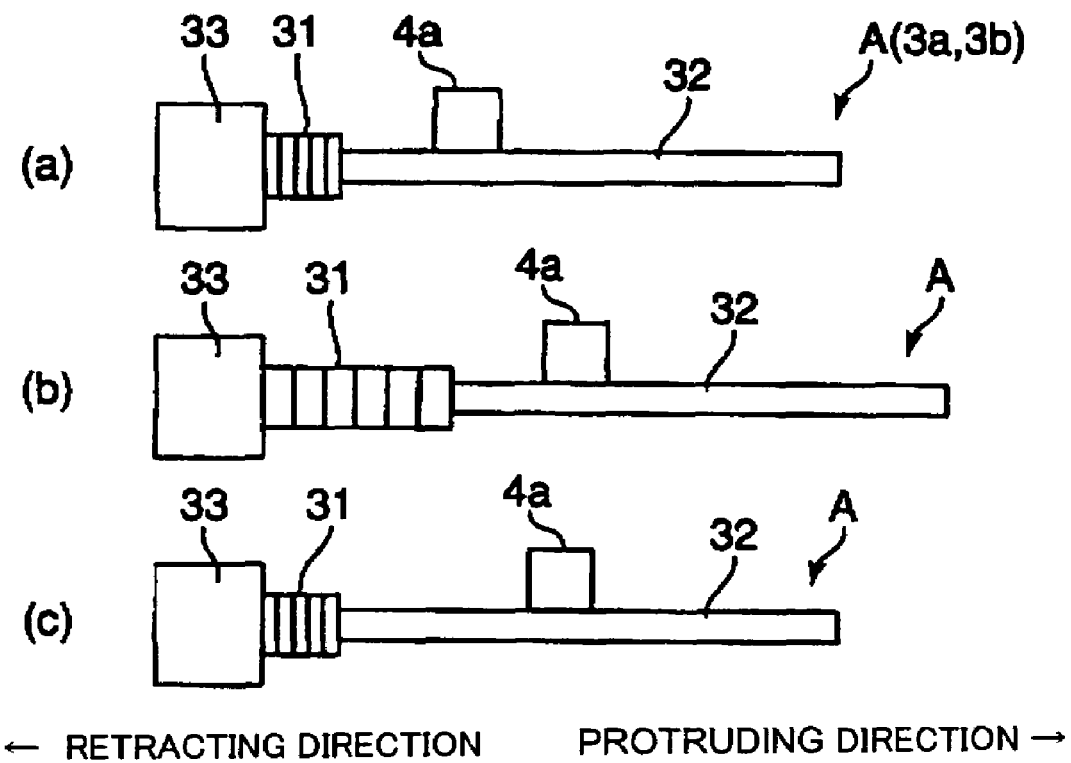
FIG. 14 is a schematic diagram describing a driving state of an actuator.

In the present embodiment, a piezoelectric actuator is used as the yaw direction actuator 3b (pitch direction actuator 3a). Here, the configuration and the operation of the actuator are described below with reference to FIGS. 14 and 15. As shown in FIG. 14(a), the piezoelectric actuator A comprises: a piezoelectric element 31 composed of an electromechanical transducer such as a piezoelectric element; a driving shaft 32 fixed to an edge of the electrostrictive direction (expansion and contraction direction) of the piezoelectric element 31; a weight member 33 fixed to the other end of the piezoelectric element 31; a movable member 4a (corresponding to the slider 4 in the present embodiment) in which frictional coupling is established with the driving shaft 32 in a manner movable thereon. Then, in response to the expansion or contraction action of the piezoelectric element 31, the driving shaft 32 moves in the protruding direction or the retracting direction in the figure. Here, the weight member 33 is fixed (fixed by the weight attaching section 2233 in the example of FIG. 11) so that the elongating direction of the piezoelectric element 31 is restricted.

Figure 15:
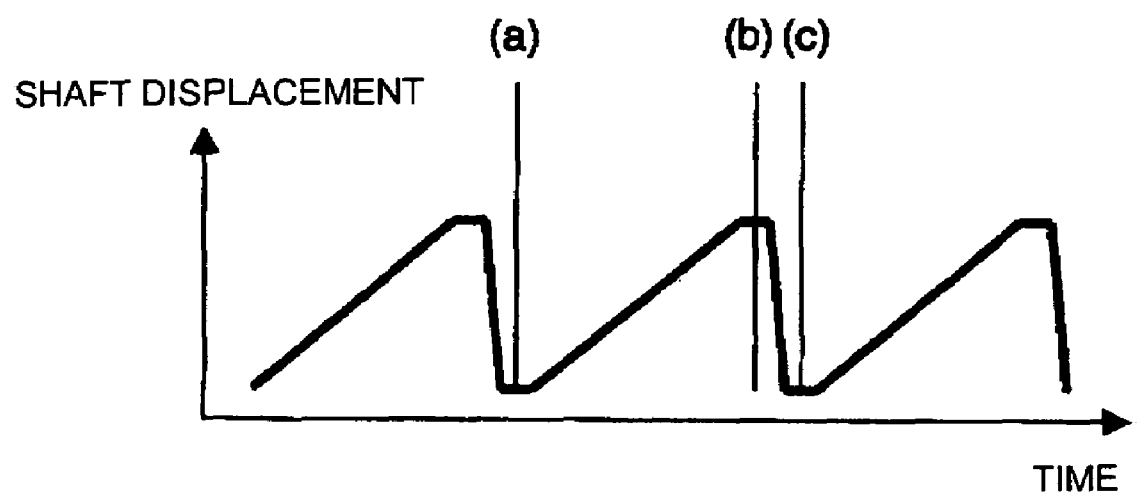
FIG. 15 is a graph showing the displacement of a driving shaft of an actuator.

FIGS. 14(a)-14(c) are schematic diagrams showing the state of protruding and retracting motion of the movable member 4a on the driving shaft 32. FIG. 15 is a graph showing the shaft displacement of the driving shaft 32 along a time axis. That is, a rectangular driving pulse voltage having a predetermined duty ratio is provided to the piezoelectric element 31 such that the driving member should perform shaft displacement motion having a sawtooth shape as shown in FIG. 15. Here, the state diagrams of FIGS. 14(a), 14(b), and 14(c) respectively correspond to the time points (a), (b), and (c) in FIG. 15.

FIG. 14(a) shows the initial state. When the state transits to FIG. 14(b), that is, when elongating in the protruding direction, the piezoelectric element 31 (driving shaft 32) performs a gradual elongating displacement as shown in the graph of FIG. 15. In response, the driving shaft 32 is also moved in the protruding direction at the gradual speed. Thus, the movable member 4a in which frictional coupling is established with the driving shaft 32 follows and displaces synchronously to the frictional coupling force. Next, when the state transits from FIG. 14(b) to FIG. 14(c), that is, when the piezoelectric element 31 performs a rapid contracting displacement so that the driving member 32 is moved in the retracting direction rapidly, slipping arises in the frictional coupling section between the movable member 4a and the driving shaft 32. As a result of this slipping, the movable member 4a does not follow and displace in accordance with the shaft displacement of the driving shaft 32, but retracts slightly in the retracting direction.

When such operation is repeated, the movable member 4a is moved on the shaft of the driving shaft 32 in the protruding direction departing from the piezoelectric element 31. When the shaft displacement pattern of FIG. 15 is reversed (a pattern in which a steep rise is followed by a gradual fall), a phenomenon opposite to the above-mentioned one occurs so that the movable member 4a is moved in the retracting direction. In the yaw direction actuator 3b, the movable member 4a corresponds to the slider 4, while the slider 4 is swung in the yaw direction by the yaw direction actuator 3b.

The reason why the elastic adhesive 36, 371, 372 is used for fixing the actuator as described above is as follows. That is, since the piezoelectric element has a small amount of displacement in general, in order that the actuator using a piezoelectric element should be driven efficiently, its driving is preferably performed using a resonance phenomena, and hence it is desirable not to invalidate the resonance phenomena. However, when a certain amount of displacement is ensured, a rigid adhesive may be used.

In addition to the above-mentioned yaw direction actuator 3b, the shake base plate 22 comprises a Hall sensor 57 constituting a part of the position detection sensor section 55 for detecting the two-dimensional position of the image pickup device 20. The flexible wiring board 59 transmits to the control section an electric signal generated by the Hall sensor 57, as well as performs the signal transmission to the pitch direction actuator 3a as described later. The flexible wiring board 59 is provided with a connection section 591. An end of the flexible wiring board 391 (see FIG. 12) for pitch is connected to the connection section 591.

<<On Image Pickup Device Holder>>

Then, the image pickup device holder 26 is described below with reference to FIG. 12 (see FIG. 7 for a side view). The image pickup device holder 26 retains the image pickup device 20 and the low pass filter 21 as described above, and further retains an image pickup device board 261, a pitch direction actuator 3a, a magnet 56 for position detection, a heat sink 265, and the like. In order to retain these elements, the image pickup device holder 26 comprises: a receptacle screw hole (not shown) for the screw 2611 for attaching the image pickup device board 261; an actuator attaching section 263 for fixing the pitch direction actuator 3a; and a magnet attaching section 264 having a recess for accommodating the magnet 56. The image pickup device holder 26 further comprises a rigid ball receptacle section 2621 formed in a projection flat section 262 protruding at one corner part of the image pickup device holder 26 having a rectangular shape in plan view.

On the rear side of the image pickup device 20, the image pickup device board 261 is fixed to the image pickup device holder 26 with a screw 2611. Between the image pickup device board 261 and the image pickup device, a heat sink 265 is inserted that is composed of an aluminum plate and having approximately the same size as the image pickup device 20 (see FIG. 7). In the heat sink 265, a side end section on the control board 6 side is extended, while this extended section serves as a flexible member guide section 2651. The flexible member guide section 2651 has a bending part bent toward the front direction of the camera optical axis and thereby guides the flexible wiring board 201 to the space part G between the frame side wall part 1155 and the battery holder 651 in such a manner that the rear face of the flexible wiring board 201 abuts against the bending part. According to this configuration, even when the shake correction unit 2 swings so that the belt-shaped flexible wiring member 201 follows this swing and thereby undergoes bending deformation or twist deformation, the flexible wiring member 201 does not suffer damage.

In a state that the image pickup device holder 26 and the shake base plate 22 are stacked up, the projection flat section 262 is protruded at a corner part at the position where the first connection spring attaching section 224 of the shake base plate 22 is provided. In the rigid ball receptacle section 2621, rigid balls B1 and B2 abut against the upper and the lower surfaces as described later in FIG. 21.

Similarly to the above-mentioned yaw direction actuator 3b, the pitch direction actuator 3a attached to the actuator attaching section 263 comprises a piezoelectric element 31a, a driving shaft 32a, and a weight member 33a having a rectangular shape. A drive voltage is provided to the piezoelectric element 31a through the flexible wiring board 391 for pitch via a lead wire 391L. The actuator attaching section 263 comprises: a tip attaching section 2631 composed of a protruding piece provided with a through hole for retaining the tip part 321a of the driving shaft 32a; an intermediate attaching section 2632 composed of a protruding piece provided with a through hole for retaining the vicinity of the pedestal part 322a of the driving shaft 32a; and a weight attaching section 2633 composed of a recess for accommodating the weight member 33a. The actuator attaching section 263 further comprises a locking section 2634 protruded in the shape of an arch over the weight attaching section 2633, so that the weight member 33a can be inserted under the arch-shaped locking section 2634.

The tip part 321a of the driving shaft 32a is fixed to the tip attaching section 2631 with elastic adhesive 36. At two positions on the front side (driving shaft 32a side), the weight member 33a is fixed to the weight attaching sections 2633 on the front side with elastic adhesive 371. On the other hand, also on the rear side, the weight member 33a is fixed to the arch-shaped locking sections 2634 at two positions on the rear side with elastic adhesive 372. The operation of the pitch direction actuator 3a fixed to the actuator attaching section 263 as described above is similar to that of the above-mentioned yaw direction actuator 3b. However, when the pitch direction actuator 3a operates, the image pickup device holder 26 swings in the pitch direction relative to the slider 4.

The reason why the weight member 33a is fixed on the front side and the rear side (four positions on the front side and the rear side) with the elastic adhesive 371 and 372 as described above is as follows. That is when the pitch direction actuator 3a (the yaw direction actuator 3b is similar) is operated so that the slider 4 serving as the moving body is moved mutually, its inertia causes a reaction force acting on the fixing part (adhesive part) of the weight member 33a. This reaction force increases with increasing size (weight) of the moving body. Thus, when a large moving body (slider 4) having a frame shape is adopted as in the present embodiment, a large reaction force is expected.

Figure 16:
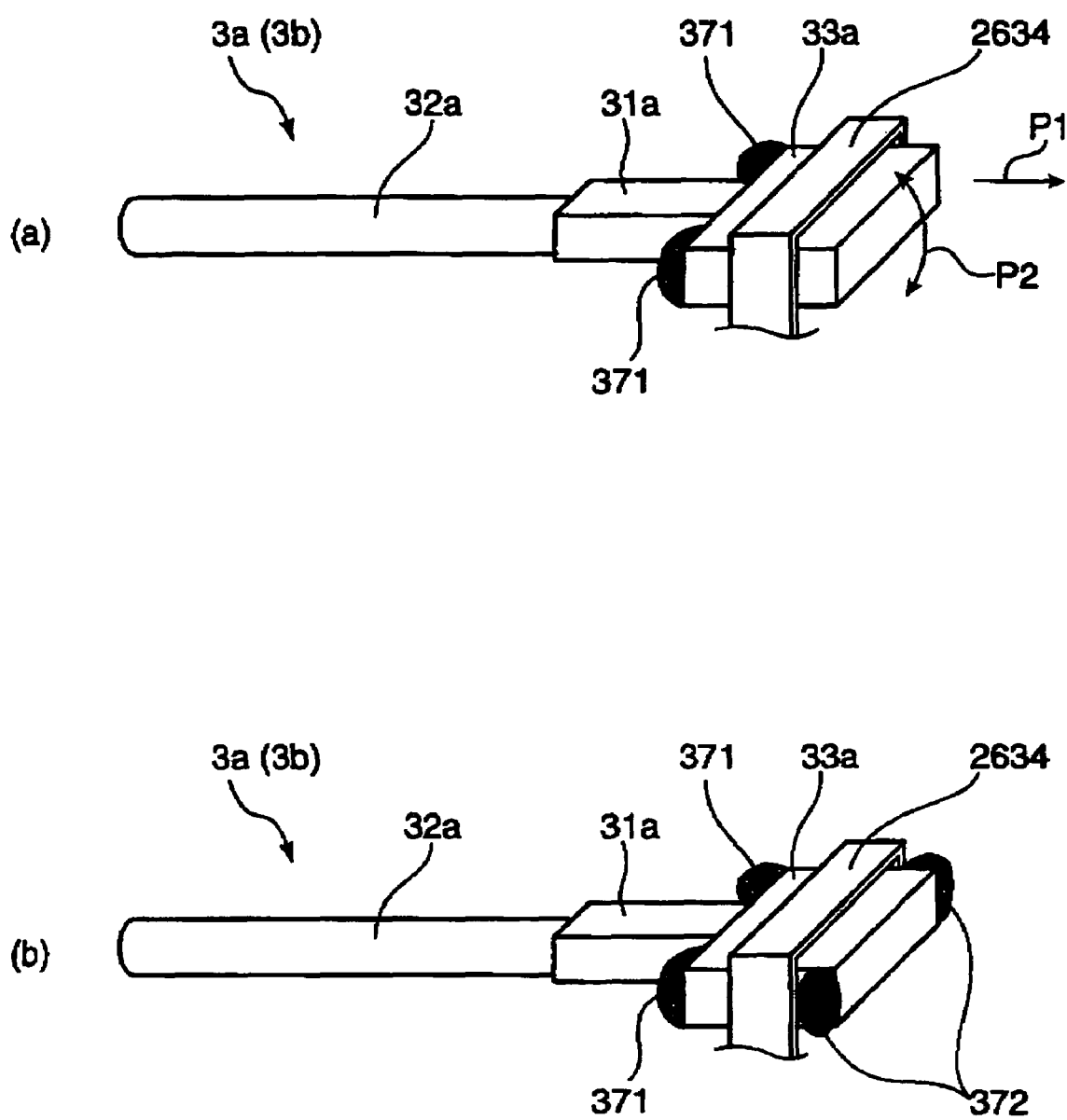

FIG. 16 is a perspective view showing a fixed (adhered) state of the pitch direction actuator 3a. As shown in FIG. 16(a), if the weight member 33a were fixed solely on the front side with the adhesive 371, the weight member 33a could move in the direction of an arrow p1 in the figure in the case of a large reaction force. Such a motion of the weight member 33a causes a delay in the servo control like the shake correction using the actuator, and hence can prevent stable servo control.

Further, when a shock is exerted to the camera body 10, a force is generated that rotates the weight member 33a together with the piezoelectric element 31a which is integrated therewith by the adhesive 371, in the direction of an arrow p2 in the figure. When this rotation force acts on the weight member 33a, in general, the piezoelectric element 31a composed of a ceramic material can be broken.

Said, in the present embodiment, as shown in FIG. 16(b), the weight member 33a is fixed not solely on the front side with the adhesive 371 but also on the rear side of the weight member 33a with the adhesive 372. This fixing structure restricts firmly the moving force of the weight member 33a. Thus, even when a large reaction force is generated as described above, or alternatively even when a rotation force is generated by a shock, the weight member 33a does not move. This permits stable servo control. Further, even when a shock is exerted, the piezoelectric element 31a is hardly broken.

The magnet 56 retained in the magnet attaching section 264 constitutes a part of the position detection sensor section 55 for detecting the position of the image pickup device 20, and performs sensing operation in cooperation with the Hall sensor 57 fixed to the shake base plate 22. FIG. 17(a) is a diagram schematically showing an example of the position detection sensor section 55.

The Hall sensor 57 is composed of a magnetic field detecting element for generating an electric signal in response to the magnetic field, and comprises a first Hall sensor 571 and a second Hall sensor 572 aligned in the directions of motion (directions of arrows x1 and x2 in the figure) of the magnet 56. The magnet 56 is arranged opposite to these Hall sensors. The first Hall sensor 571 and the second Hall sensor 572 generates output voltages V1 and V2, respectively, in response to the magnetic field generated by the magnet 56.

When the magnet 56 generates a uniform magnetic field while a boundary part 573 between the first Hall sensor 571 and the second Hall sensor 572 is located at an intermediate part 561 of the magnet 56, the output voltages V1 and V2 are approximately equal to each other so that the difference between the output voltages V1 and V2 equals zero. On the other hand, when the magnet 56 moves in the arrow x1 direction, the magnetic field received by the first Hall sensor 571 becomes stronger so that the output voltage V1 becomes higher than the output voltage V2 of the second Hall sensor 572. Thus, V1-V2 becomes a positive voltage. In contrast, when the magnet 56 moves in the arrow x2 direction, the magnetic field received by the second Hall sensor 572 becomes stronger on the contrary, so that the output voltage V2 becomes higher than the output voltage V1 of the first Hall sensor 571. Thus, V1-V2 becomes a negative voltage.

This situation is shown in the graph of FIG. 17(b). That is, depending on the amount of motion of the magnet 56 in the arrow x1 or x2 direction, the difference between the output voltages V1 and V2 changes linearly. Thus, when a Hall sensor is arranged in each of the four directions in a manner opposing the magnet 56, the position of the magnet 56 in the two-dimensional plane is detected. The Hall sensor 57 actually built in the shake base plate 22 is a unit type sensor in which four Hall elements are embedded.

In the present embodiment, such a Hall sensor 57 is built in the shake base plate 22 serving as the fixed board. On the other hand, the magnet 56 is attached to the image pickup device holder 26 serving as the moving board. Thus, even when the two-dimensional swing of the image pickup device holder 26 (that is, the image pickup device 20) is performed by the pitch direction actuator 3a and the yaw direction actuator 3b, the present position of the image pickup device 20 is detected.

<<On Slider>>

Next, the slider 4 is described below with reference to FIG. 13. The slider 4 is a moving board having a rectangular frame shape provided with a window part 400, and comprises: a body frame 41 provided with four sides and composed of resin; a first frictional coupling section 40a for the pitch direction actuators 3a arranged in one vertical side 41B of the body frame 41; a second frictional coupling section 40b for the yaw direction actuators 3b arranged in one horizontal side 41H of the body frame 41; a first extending section 43 protruding in a first corner part of the body frame 41 and provided with a second connection spring attaching section 431, a rigid ball receptacle plate 432, and the like; a second extending section 44 protruding in a second corner part diagonal to the first corner part and providing a shock buffering function.

Figure 18:
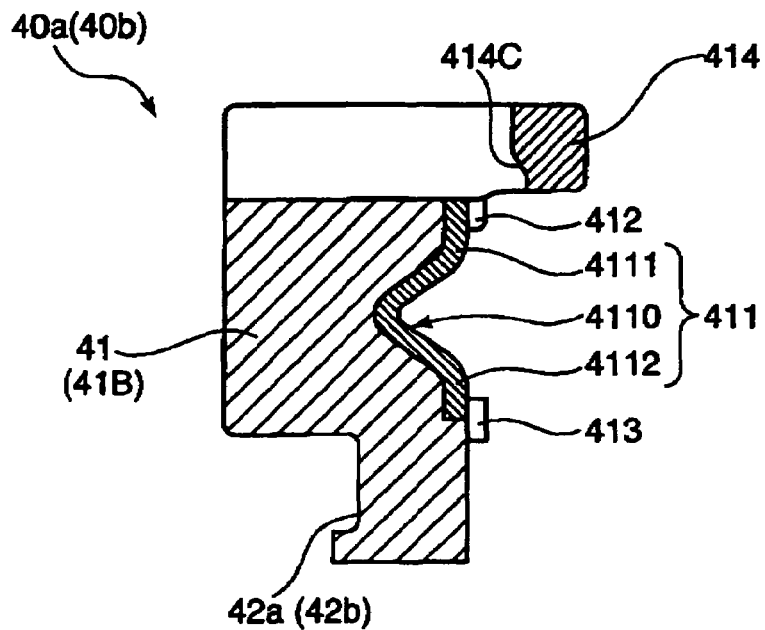
FIG. 18 is a sectional view showing the configuration of a frictional coupling section of a slider.

FIG. 18 is a sectional view showing the configuration of the first frictional coupling section 40a (the second frictional coupling section 40b is similar). In the first frictional coupling section 40a, a groove having a V-shaped cross section is provided in the body frame 41, while a V-shaped metal member 411 bent into a V-shaped cross section is inserted into the V-shaped groove. More specifically, the V-shaped metal member 411 comprises: a V-shaped bend part 4110 in the center of the width direction; and horizontal sections 4111 and 4112 each extending in the form of a flange at each end of the V-shaped bend part 4110. A pair of claw parts 412 and 413 are arranged respectively on the horizontal sections 4111 and 4112 in a manner overlapping partly. That is, the horizontal sections 4111 and 4112 are pressed down by the claw parts 412 and 413 so that the V-shaped metal member 411 is fixed to the body frame 41.

A pressing plate receptacle section 414 into which a pressing plate 45 (see FIG. 19) is inserted is protruded in a side part (inner side part) on the window part 400 side of the first frictional coupling section 40a. A cavity 414C for accepting (an end 452 of) the pressing plate 45 is provided under the pressing plate receptacle section 414. Further, a spring retaining section 42a (42b) for retaining a later-described pressing force adjustment spring 46 for providing a stoppage force to the pressing plate 45 is provided in an outer side part of the first frictional coupling section 40a.

The second connection spring attaching section 431 of the first extending section 43 is a through hole, into which a connection spring 228 described later is hung. The rigid ball receptacle plate 432 is composed of a metal plate, and embedded in the body frame 41 composed of resin. The second extending section 44 is a protruding piece composed of resin.

As described above, the slider 4 is constructed from a composite member consisting of the body frame 41 composed of resin; and the V-shaped metal member 411 and the rigid ball receptacle plate 432 each composed of metal. The reason why the slider 4 is constructed from such a composite member composed of resin and metal is as follows. That is, the frictional coupling sections 40a and 40b for establishing frictional coupling with the driving shafts 32a and 32b of the actuators 3a and 3b are desirable to be composed of a metal member generally having an anti-wear property, in order to ensure the durability against friction. Nevertheless, in contrast to the present embodiment, when the first frictional coupling section 40a and the second frictional coupling section 40b were not constructed from distinct members, but were integrated into the body frame 41 having a frame shape, the weight would increase in the slider 4 since the entirety of the body frame 41 would be composed of metal.

When the weight increases in the slider 4, the response speed becomes slow in the case that a swing force is exerted by the actuators 3a and 3b. This degrades the shake correction performance. Thus, in the present embodiment, the V-shaped metal member 411 which is a metal member is attached to each of the first frictional coupling section 40a and the second frictional coupling section 40b which are a necessarily minimum portion, while the rigid ball receptacle plate 432 is attached to the first extending section 43, so that weight reduction is achieved in the slider 4 in order that degradation is avoided in the response characteristics in the shake correction driving.

The slider 4 is preferably fabricated by an insertion molding method in which a V-shaped metal member 411 formed by bending a metal plate into a predetermined V shape is set up in a mold cavity, and then resin material for constructing the body frame 41 is melted and injected into the mold cavity. For example, the entirety of the slider 4 is to be constructed as a metal member, die casting molding is employed in general. Nevertheless, die casting molding results in a rough surface unavoidably. This causes a problem that the obtained frictional coupling surface is not stable. Thus, a necessity arises for a secondary processing such as milling or alternatively a surface treatment, in order that the frictional coupling surface should be stabilized. However, when insertion molding is adopted as in the present embodiment, it is sufficient to prepare in advance a metal plate having a desired friction surface or a metal plate having resistance against the rigid ball. This provides an advantage in the characteristics and the fabrication workability.

The resin material constructing the body frame 41 of the above-mentioned slider 4 is preferably such that insertion molding is possible and that a high strength is obtained. For example, PPS, PC resin, or the like may be employed. Further, the V-shaped metal member 411 is preferably a metal member having a high surface hardness and anti-wear property and having a large specific gravity. For example, SUS, phosphor bronze, or the like may be employed.

The description given above is a desirable mode of the slider 4. However, when the response characteristics and the like in the shake correction driving do not cause a special problem, the entirety of the slider may be composed of a metal member. Alternatively, the entirety of the slider including the frictional coupling section may be composed of a resin member having good anti-wear property.

(Description of Attachment Structure of Each Component Member of Shake Correction Unit)

Figure 19:
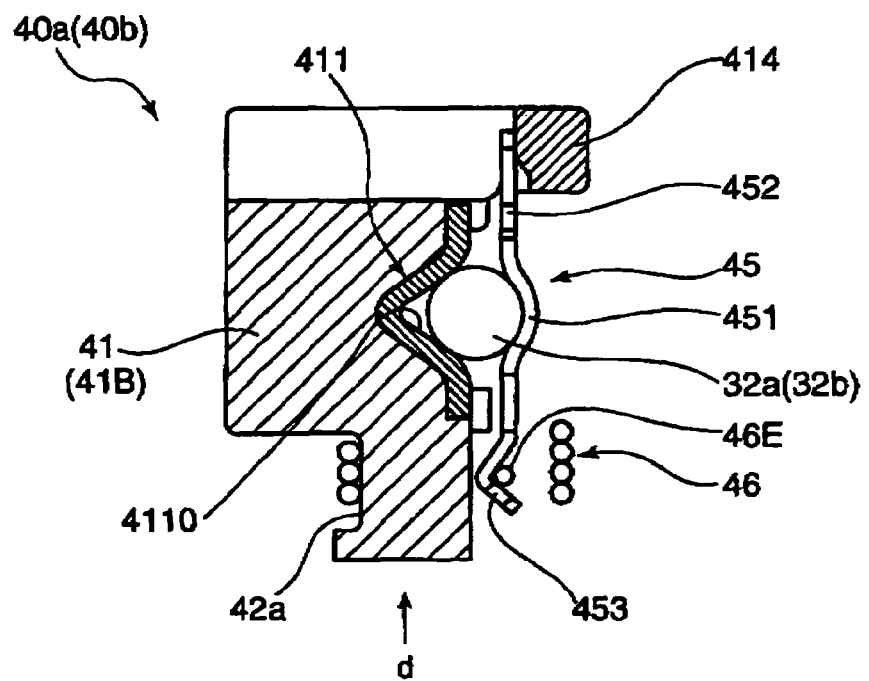
FIG. 19 is a sectional view showing the joining structure in which a driving shaft of an actuator and a pressing plate are attached to a frictional coupling section of a slider.
Figure 20:
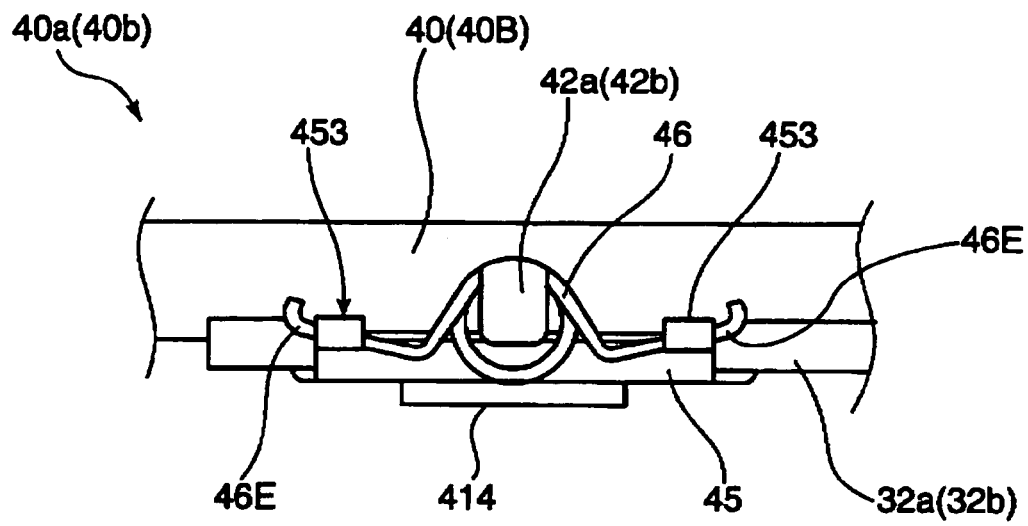
FIG. 20 is a diagram viewed from the direction of an arrow d of FIG. 19.

Next, the attachment structure of the shake base plate 22, the image pickup device holder 26, the slider 4, the pitch direction actuator 3a, the yaw direction actuator 3b, and the like is described below. The configuration after the attachment of these component members is as shown in FIG. 10. In FIG. 10, the slider 4 of FIG. 13 is stacked on the shake base plate 22 in a state reversed by 180 degrees. FIG. 19 is a sectional view showing the joining structure with the driving shaft 32a of the pitch direction actuator 3a (the yaw direction actuator 3b is similar) in the first frictional coupling section 40a (the second frictional coupling section 40b is similar) of the slider 4. FIG. 20 is a diagram viewed from the direction of an arrow d of FIG. 19.

In the V-shaped bend part 4110 of the V-shaped metal member 411 in the first frictional coupling section 40a, the outer periphery of a half surface side of the driving shaft 32a is arranged in an abutting manner. On the other hand, the pressing plate 45 abuts against the other half surface side of the driving shaft 32a. The pressing plate 45 comprises: a bending part 451 abutting against the driving shaft 32a; an insertion end 452 inserted into the cavity 414C of the pressing plate receptacle section 414 provided in the slider 4; and a locking section 453 in which the pressing force adjustment spring 46 is hung.

The pressing plate 45 abuts against the driving shaft 32a in a predetermined pressing force, and thereby sets up a predetermined frictional coupling force between the driving shaft 32a and the V-shaped metal member 411. That is, when inserted into the cavity 414C, the insertion end 452 of the pressing plate 45 is pressed and fixed by the lower surface of the pressing plate receptacle section 414. On the other hand, the lock stop section 453 is pressed down resiliently by the pressing force adjustment spring 46 having a predetermined spring force.

That is, the pressing force adjustment spring 46 is composed of a spring, and retained in such a manner that the spring body is inserted into the spring retaining section 42a (42b). Then, as shown in FIG. 20, each end 46E of the pressing force adjustment spring 46 is locked by the locking section 453 of the pressing plate 45. By virtue of the pressing force adjustment spring 46, the pressing plate 45 is biased toward the slider 4 (V-shaped metal member 411) by the two ends 46E of the pressing force adjustment spring 46 having a spring property, in such a manner that the spring retaining section 42a protruding in the slider 4 serves as a fulcrum. Thus, the driving shaft 32a is pressed by the bending part 451 of the pressing plate 45 at a predetermined spring force provided in the pressing force adjustment spring 46, so that frictional coupling is established between the driving shaft 32a and the V-shaped metal member 411.

Figure 21:
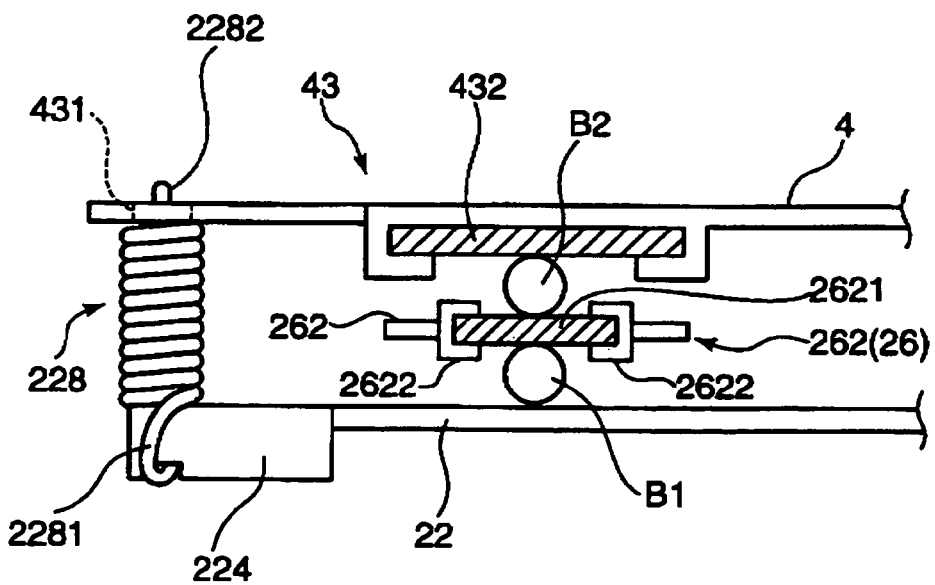
FIG. 21 is a sectional view showing the structure of an elastic connection section between a shake base plate and a slider, taken along line e-e of FIG. 10.

FIG. 21 is a sectional view showing the elastic connection section between the shake base plate 22 and the slider 4, taken along line e-e of FIG. 10. That is, the shake base plate 22 and the slider 4 are eventually connected by the frictional coupling between the driving shaft 32b of the yaw direction actuator 3b and the V-shaped metal member 411 via the pressing plate 45 in the second frictional coupling section 40b. Nevertheless, this connection alone cannot prevent the slider 4 from rotating (rotation in the direction levitating from the paper surface of FIG. 10). Thus a connection spring 228 connects the two elements on the distant end side of the second frictional coupling section 40b. Further, in order that the slider 4 can swing in the pitch direction even in the connected state, the sliding structure using the steel balls B1 and B2 is adopted.

In FIG. 21, the first connection spring attaching section 224 of the shake base plate 22 and the second connection spring attaching section 431 of the slider 4 are in a state positioned in the height (thickness) direction. Then, the connection spring 228 is attached in this state. That is, the connection spring 228 is composed of a compression spring. One spring end 2281 thereof is locked to the first connection spring attaching section 224 of the shake base plate 22, while the other spring end 2282 is locked to the second connection spring attaching section 431 of the slider 4, so that the shake base plate 22 and the slider 4 are connected by a predetermined spring force.

The steel balls B1 and B2 are arranged near the connection section using the connection spring 228. The projection flat section 262 of the image pickup device holder 26 is provided with a rigid ball receptacle section 2621 for accepting the steel balls B1 and B2 in the upper and the lower surfaces. The rigid ball receptacle section 2621 is composed of a metal plate having resistance against the steel balls B1 and B2, and embedded in a manner that its edge is retained by the projection flat section 262 composed of resin. The retaining section 2622 for retaining the edge of the rigid ball receptacle section 2621 is a thick member, so that the retaining section 2622 serves as a stopper for the steel balls B1 and B2. Further, as shown in FIG. 12, the rigid ball receptacle section 2621 is an elongate plate in the pitch direction, and hence does not block the swing of the image pickup device holder 26 in the pitch direction relative to the slider 4.

The slider 4 also is provided with a rigid ball receptacle plate 432 for accepting the steel ball B2. This rigid ball receptacle plate 432 also is composed of a metal plate and embedded in a manner that its edge is retained by the first extending section 43 composed of resin. Then, the steel ball B1 is arranged between the shake base plate 22 and the rigid ball receptacle section 2621 of the image pickup device holder 26, while the steel ball B2 is arranged between the rigid ball receptacle section 2621 and the rigid ball receptacle plate 432 of the slider 4. Thus, the image pickup device holder 26 maintains predetermined intervals relative to the shake base plate 22 and the slider 4. Yet, when a driving force of the pitch direction actuator 3a is received, the image pickup device holder 26 can slide freely in the pitch direction by the rolling of the steel ball B1 and the steel ball B2.

Figure 22:
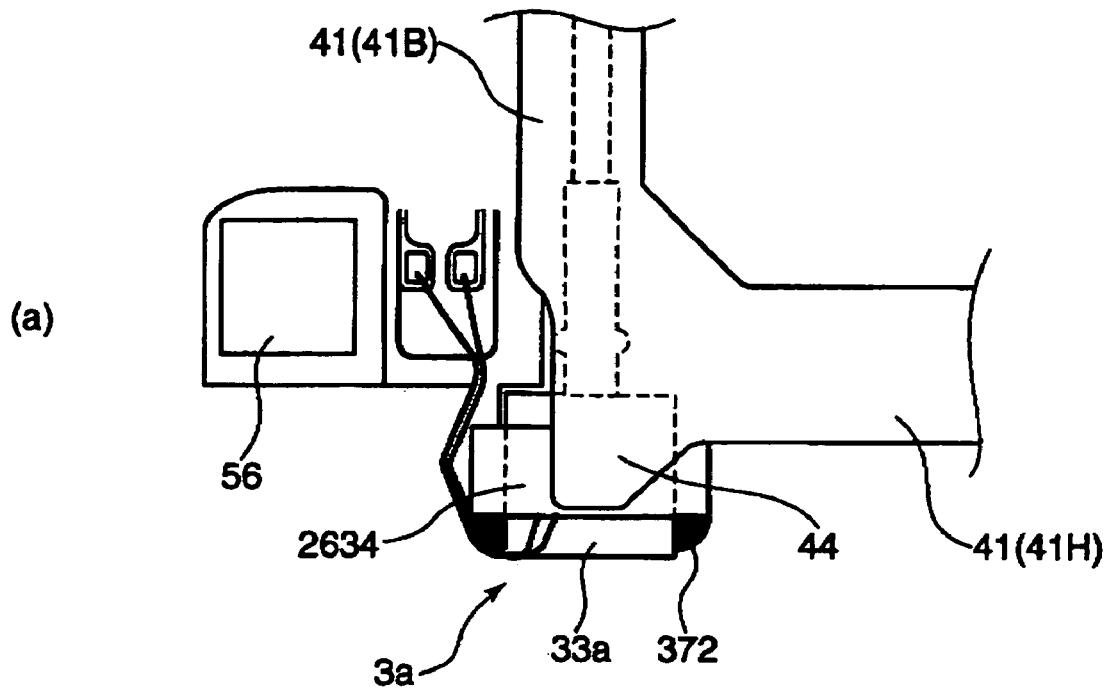
FIG. 22 is an enlarged view showing an overlap part (an arrow f section in FIG. 10) in end portions of a slider and an image pickup device holder.
Figure 22:
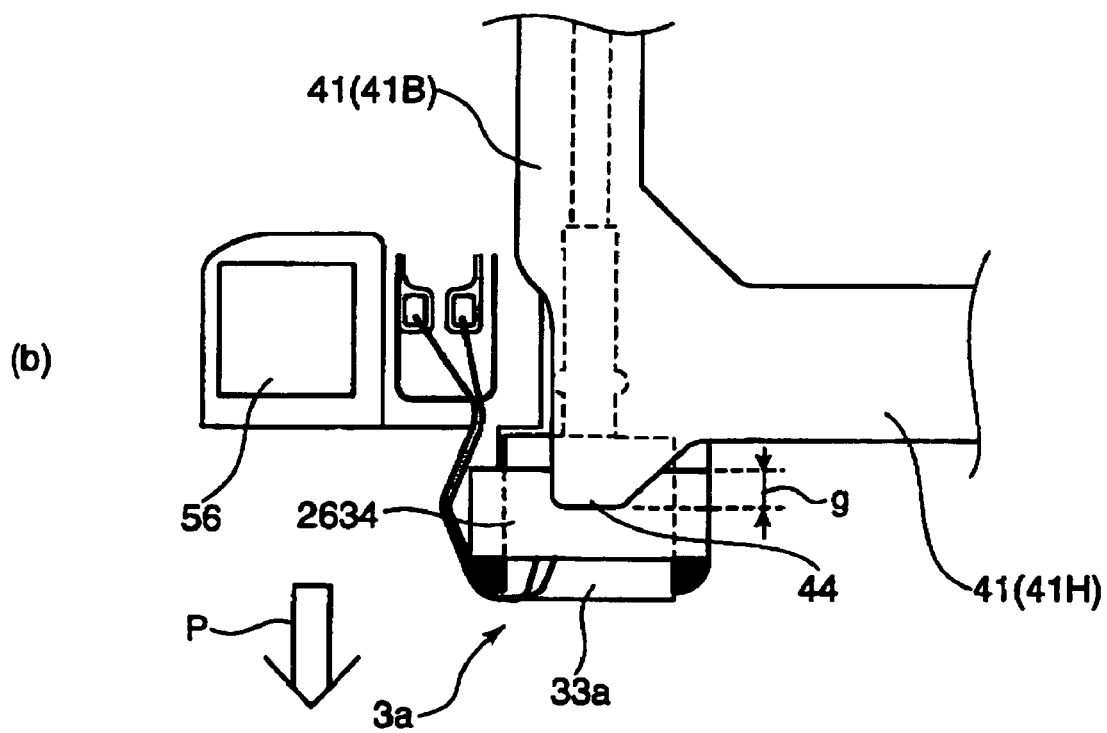

FIG. 22 is an enlarged view showing an overlap part (an arrow f section in FIG. 10) in end portions of the slider 4 and the image pickup device holder 26. In the present embodiment, even when the slider 4 and the image pickup device holder 26 displace mutually, a part of one element is close and opposite to a part of the other element. This improves the resistance against a shock.

Specifically, as shown in FIG. 22(a), the second extending section 44 having a plate shape is provided in the second corner part of the slider 4 as described above, while the arch-shaped locking section 2634 is provided in the image pickup device holder 26 in a manner covering the weight member 33a of the pitch direction actuator 3a. The top face of the arch-shaped locking section 2634 also has a plate shape, so that the lower surface of the second extending section 44 is close and opposite to the top face of the arch-shaped locking section 2634 (with a predetermined small spacing)

Then, as shown in FIG. 22(b), the image pickup device holder 26 swings relative to the slider 4 in the pitch direction (arrow p direction in the figure). However, even when the image pickup device holder 26 swings to the maximum width, the second extending section 44 and the arch-shaped locking section 2634 overlaps mutually with a predetermined overlap width g. That is, even when the image pickup device holder 26 swings anyhow relative to the slider 4, the second extending section 44 and the arch-shaped locking sections 2634 are always in a close and overlapped state.

According to this configuration, even when a shock is exerted to the camera body 10 in a direction perpendicular to the paper surface of the figure, the second extending section 44 and the arch-shaped locking section 2634 interfere with each other, so that the deformation or displacement motion of the image pickup device holder 26 is blocked. Thus, even when a shock is exerted, the image pickup device holder 26 hardly suffers damage. Further, since the weight member 33a of the pitch direction actuator 3a is fixed at four points with the elastic adhesive 371 and 372, the breakdown of the piezoelectric element 31a can be prevented effectively.

Figure 23:
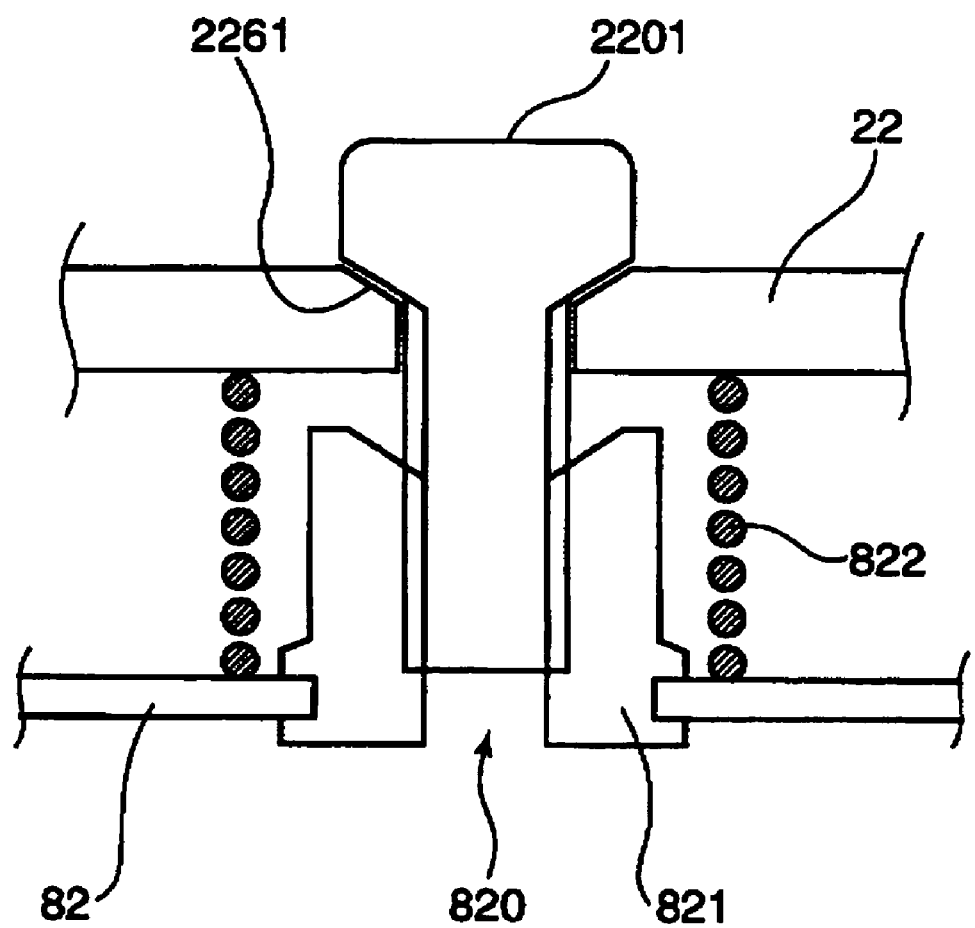
FIG. 23 is a sectional view showing the tilt adjustment mechanism.

The shake correction unit 2 attached as described above is fixed to the camera body section. Specifically, the shake base plate 22 is fixed to the shutter pressing plate 82 fixed to the frame 115 serving as a rigid body (see FIGS. 6 and 7). The shake base plate 22 and the shutter pressing plate 82 are fixed not by simple screwing but by using adjustment screws 2201-2203 for tilt adjustment. That is, the shake base plate 22 is provided with screw holes 2261-2263 at three positions, while the adjustment screws 2201-2203 are inserted into the screw holes 2261-2263 so that the two elements are fixed. At that time, as shown in FIG. 23, a tilt adjustment mechanism is provided between the shake base plate 22 and the shutter pressing plates 82.

The shutter pressing plate 82 is provided with a through hole 820, while a screw receptacle 821 is fitted into the through hole 820. The adjustment screw 2201 is screwed into the screw receptacle 821 through the screw hole 2261. A compression spring 822 is fit into the circumference of the screw receptacle 821, so that the compression spring 822 biases the shake base plate 22 and the shutter pressing plate 82 in the direction departing mutually. The portions for the other adjustment screws 2202 and 2203 are similar.

In the tilt adjustment mechanism having this configuration, when the strength of screwing the adjustment screws 2201-2203 is adjusted appropriately, the tilt is adjusted such that the image pickup plane of the image pickup device 20 agrees with the image formation position of the photographic object.

(Description of General Electrical Configuration of Digital Camera)

Figure 24:
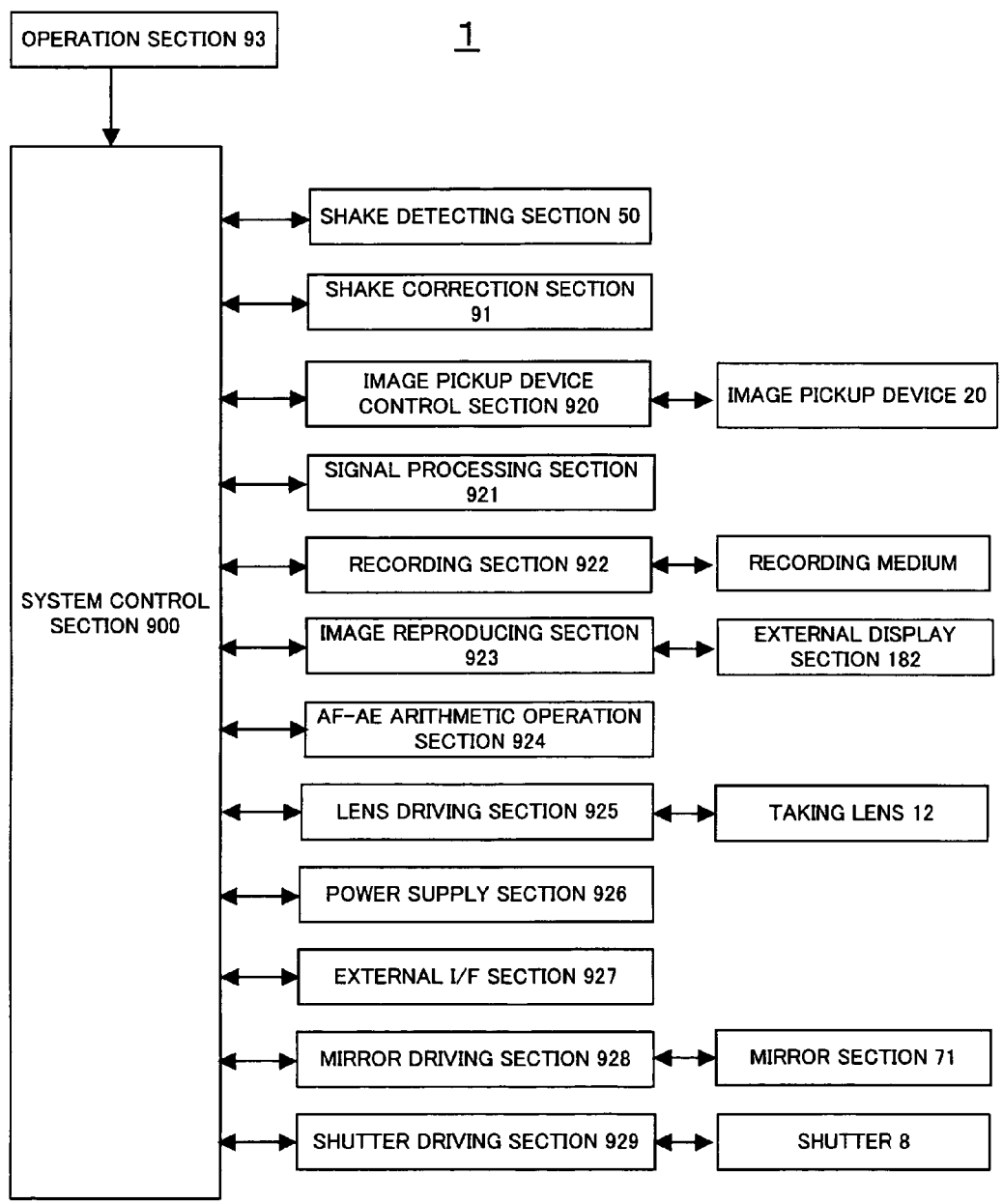
FIG. 24 is a block diagram showing the electrical configuration of a digital camera according to an embodiment.

Next, the electrical configuration of the digital camera 1 according to the present embodiment is described below. FIG. 24 is a block diagram showing the electrical configuration of the digital camera 1. As shown in FIG. 24, the digital camera 1 comprises a system control section 900, a shake detecting section 50, a shake correction section 91, an image pickup device control section 920, a signal processing section 921, a recording section 922, an image reproducing section 923, an AF-AE arithmetic operation section 924, a lens driving section 925, a power supply section 926, an external I/F section 927, a mirror driving section 928, a shutter driving section 929, and an operation section (the mode setting dial 16, the release button 17, and the like described above) 93.

The system control section 900 comprises: a ROM (Read Only Memory) for storing control programs and the like; a RAM (Random Access Memory) for temporarily storing data for data processing and control processing and the like; and a CPU (Central Processing Unit) for reading and executing the above-mentioned control programs and the like from the ROM. Thus, the system control section 900 controls the operation of each part of the digital camera 1 in response to various signals received from the shake detecting section 91, the operation section 93, the driving section, and the like.

The shake detecting section 50 is provided with the pitch direction gyroscope 50a and the yaw direction gyroscope 50b as described above (see FIG. 5), and thereby detects a shake (camera shake) exerted to the camera body 10. On the basis of the shake information detected by the shake detecting section 50 and the position information of the image pickup device 20 detected by the position detection sensor section 55, the shake correcting section 91 arithmetically calculates the amount of motion of the image pickup device 20 caused by the pitch direction actuator 3a and the yaw direction actuator 3b.

The image pickup device control section 920 controls the photoelectric conversion of the image pickup device 20 (CCD), and performs predetermined analog processing such as Gain (amplification) on the output signal of the image pickup device 20. Specifically, the image pickup device control section 920 causes a timing generator provided in the image pickup device control section 920 to output a driving control signal to the image pickup device 20, so that exposure to the object light should be performed for a predetermined time. The result is converted into an image signal. This image signal is processed by Gain change, and then transmitted to the signal processing section 921.

The signal processing section 921 performs predetermined analog signal processing and predetermined digital signal processing onto the image signal transmitted from the image pickup device 20, and comprises an analog signal processing circuit and various digital signal processing circuits. The analog signal processing circuit comprises: a CDS (correlation double sampling) circuit for reducing the sampling noise of the image signal; and an AGC (automatic gain control) circuit for performing level adjustment of the image signal, and thereby performs predetermined analog signal processing onto the image signal having analog values outputted from the image pickup device 20. The image signal outputted from the analog signal processing circuit is converted into an image signal having digital values by an A/D conversion circuit, and then transmitted the digital signal processing circuit. The digital signal processing circuit comprises: an interpolation circuit for performing pixel interpolation on the A/D-converted pixel data; a black level correction circuit for correcting the black level of each A/D-converted pixel data into a reference black level; a white balance (WB) circuit for adjusting the white balance of the image; and a γ correction circuit for correcting the γ property of the pixel data and thereby performing gray level correction. The digital signal processing circuit further comprises is an image memory for temporarily storing the image data having undergone the signal processing.

The recording section 922 records the generated image data into the recording medium M (such as a memory card) capable of being detached and attached, and reads the image data recorded in the recording medium. The image reproducing section 923 processes the image data generated by the signal processing section 921 or alternatively the image data read from the recording medium by the recording section 922, and thereby generates image data appropriate for the display in the external display section 182.

The AF-AE arithmetic operation section 924 performs operation for the automatic focusing control (AF) and the automatic exposure control (AE). The lens driving section 925 controls the drive of the lens group 122 of the taking lens 12. Here, the taking lens 12 comprises: a focus lens; a zoom lens; and a diaphragm for adjusting the amount of transmitted light, and further comprises a lens ROM for storing information specific to the lens (information such as the open F value and the focal length). The lens ROM is connected to the system control section 900 via the electrical contact provided in the mount section 13.

The power supply section 926 is composed of a battery accommodated in the battery chamber 65 of the battery holder 651, and supplies power to each part of the digital camera 1. The external I/F section 927 is composed of a connector section 68 provided with a holder for a remote terminal or a USB terminal or with a jack for an AC power supply or the like, and serves as an I/F (interface) with an external device.

The mirror driving section 928 drives the mirror section 71 (the main mirror 711 and the sub-mirror 712). In response to a retraction signal inputted from the system control section 900, the mirror driving section 928 causes the main mirror 711 to rotate and retract together with the sub-mirror 712 from the optical axis L of the taking lens 12. The retraction signal is generated by the system control section 900 when an ON signal of the release switch 17 is inputted to the system control section 900. On completion of the photographing, the mirror driving section 928 causes the mirror section 71 in the retracted state to rotate and return to the original position on the optical axis L. The shutter driving section 929 drives (the opening and closing of) the shutter 8. The operation section 93 comprises operating members such as a release switch 17, a mode setting dial 16, a direction selection key 192, and a camera shake correction switch 15, and receives instruction input generated by an operation of the user.

(Description of Electrical Configuration of Shake Correction Section)

Figure 25:
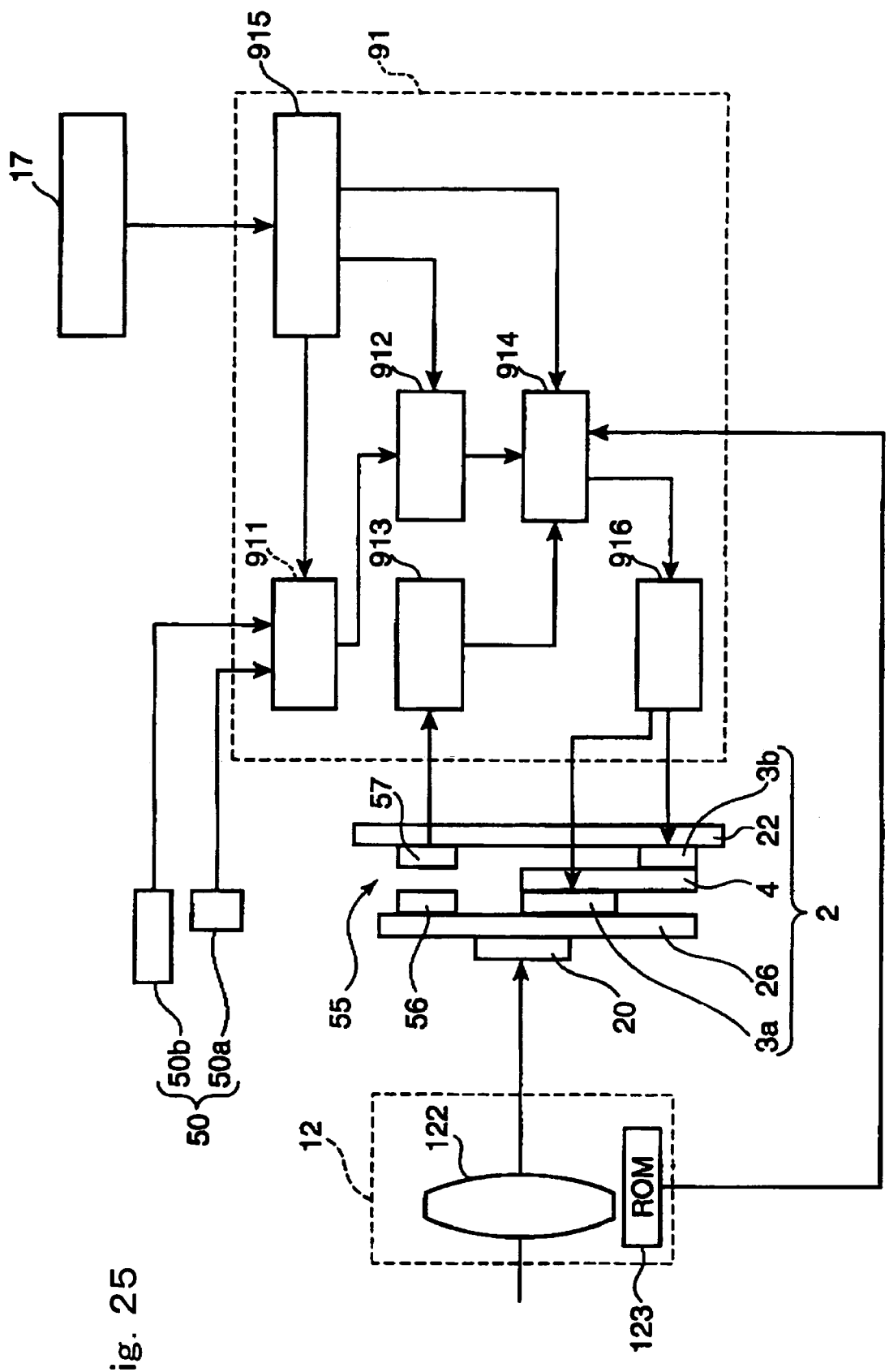
FIG. 25 is a block diagram schematically showing the electrical configuration of a shake correction mechanism, including a functional block diagram of a shake correction section.

FIG. 25 is a block diagram schematically showing the electrical configuration of the shake correction mechanism, including a functional block diagram of the shake correction section 91. Numerals attached to the configuration other than the shake correction section 91 are the same as those used above in FIGS. 1-24 (description is omitted for the same numerals). The shake correction section 91 comprises a shake detection circuit 911, a coefficient conversion circuit 912, a position detection processing circuit 913, a control circuit 914, a sequence control circuit 915, and a drive circuit 916.

The shake detection circuit 911 receives a shake angular velocity signal of the pitch direction detected by the pitch direction gyroscope 50a and a shake angular velocity signal of the yaw direction detected by the yaw direction gyroscope 50b. The shake detection circuit 911 comprises: a filter circuit (a low pass filter and a high pass filter) for reducing the noise and the drift in each detected angular velocity signal; an amplifying circuit for amplifying each angular velocity signal; and an integration circuit for converting the angular velocity signal into an angle signal. Specifically, the shake detection circuit 911 acquires each inputted angular velocity signal at predetermined time intervals, and then outputs the data to the coefficient conversion circuit 912. At that time, the amount of a shake in the X axis direction (yaw direction) of the camera body 10 is denoted by detx, while the amount of a shake of in the Y axis direction (pitch direction) is denoted by dety.

The coefficient conversion circuit 912 converts the amount (detx, dety) of a shake of each direction outputted from the shake detection circuit 911, into the amount (px, py) of motion in each direction by which the image pickup device 20 should be moved by the pitch direction actuator 3a and the yaw direction actuator 3b.

Figure 17:
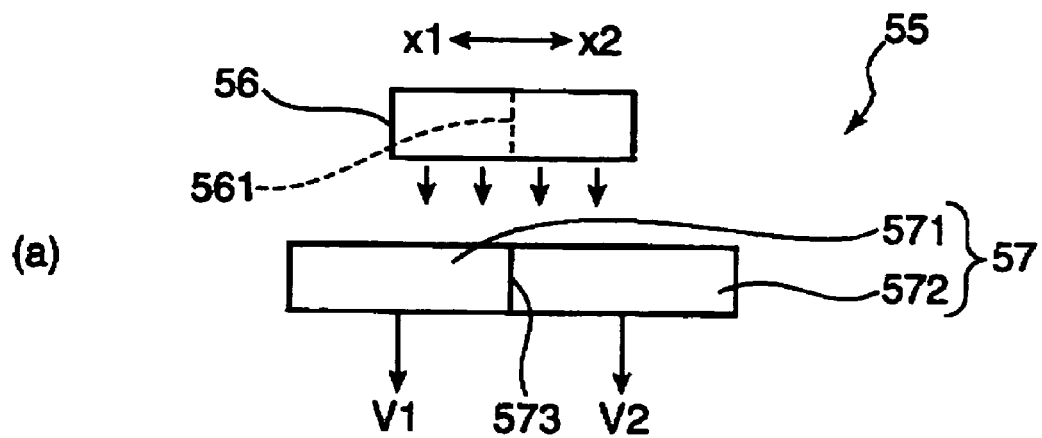
FIG. 17 is a diagram schematically showing an embodiment of a position detection sensor section.
Figure 17:
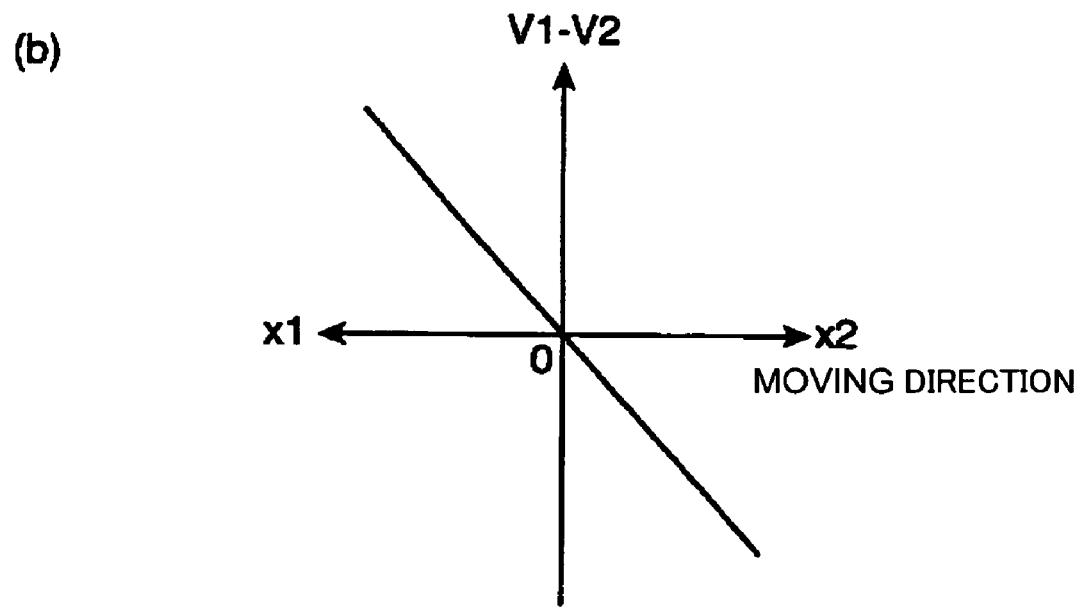

The position detection processing circuit 913 detects the output voltage of each Hall element built in the two-dimensional Hall sensor 57, and then performs data processing for calculating the position of the image pickup device 20 on the basis of the principle described in FIG. 17. The position signal calculated by the position detection processing circuit 913 and the signal indicating the amount (px, py) of motion in each direction calculated by the coefficient conversion circuit 912 are inputted to the control circuit 914.

With taking into account the position information of the image pickup device 20, the operating characteristic of the pitch direction actuator 3a and the yaw direction actuator 3b, and the like, the control circuit 914 converts the signal indicating the amount (px, py) of motion in each direction into an actual driving signal (drvx, drvy). Here, the focal distance information and the like stored in the lens ROM 123 of the taking lens 12 is acquired by the control circuit 914, so that the driving signal (drvx, drvy) is generated in accordance with the focal length of the taking lens 12 presently attached to the mount section 13. The driving signal (drvx, drvy) for each direction generated by the control circuit 914 and serving as the motion correction amount signal for the image pickup device 20 is inputted to the drive circuit 916 for generating a driving pulse for actually driving the pitch direction actuator 3a and the yaw direction actuator 3b.

The operation of the shake detection circuit 911, the coefficient conversion circuit 912, and the control circuit 914 described above is controlled by the sequence control circuit 915. That is, when the release button 17 is pushed down, the sequence control circuit 915 controls and causes the shake detection circuit 911 to acquire the data signal concerning the amount (detx, dety) of a shake in each direction described above. Then, the sequence control circuit 915 controls and causes the coefficient conversion circuit 912 to convert the amount of a shake in each direction into the amount (px, py) of motion in each direction. After that, the control circuit 914 is controlled and caused to calculate the amount of correction motion for the image pickup device 20 on the basis of the amount of motion in each direction. During the period until the release button 17 is pushed so that the exposure is terminated, the above-mentioned operation is repeated at predetermined time intervals so that the shake is corrected in the shake correction unit 2.

Figure 26:
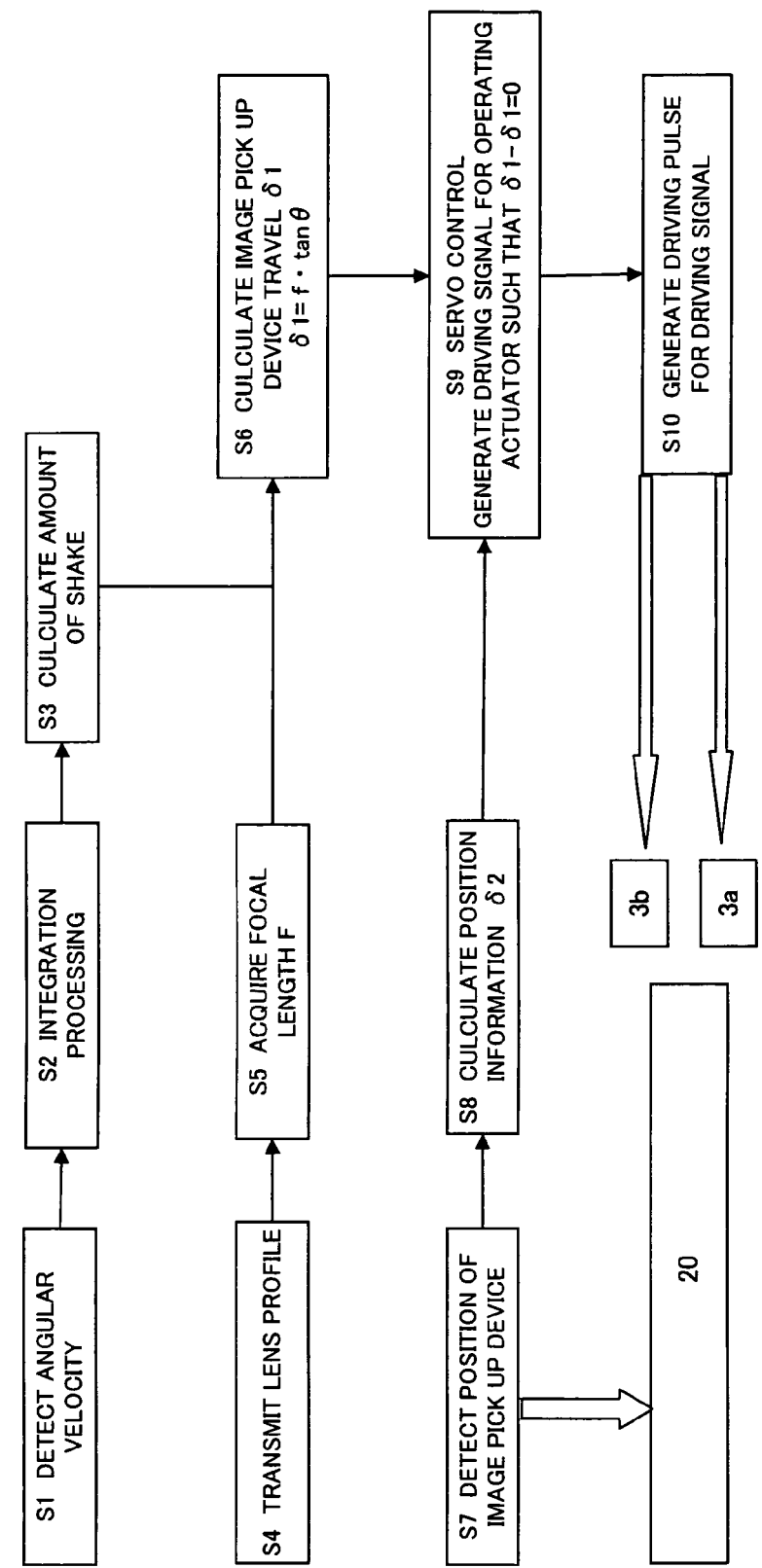
FIG. 26 is a block diagram showing a process flow of the shake correction operation in a shake correction section.

FIG. 26 is a process flow showing the shake correction operation in the shake correction section 91 described above. When the shake correction processing is started, the pitch direction gyroscope 50a and the yaw direction gyroscope 50b detects an angular velocity in response to a shake exerted to the camera body 10 (step S1). The detected angular velocity signal is inputted to the shake detection circuit 911, then undergoes integration processing, and thereby is converted into an angle signal (step S2). Then, the coefficient conversion circuit 912 calculates the amount (detx, dety) of a shake in the pitch direction and the yaw direction, that is, a shake angle θ (step S3). The information concerning the shake angle θ is inputted to the control circuit 914.

The taking lens 12 transmits a lens profile including the information concerning the focal length f stored in the lens ROM of the taking lens 12 (step S4). The information containing the focal length f is acquired by the control circuit 914 (step S5). The focal length f may be acquired not at the time of shake correction but at the time of attaching the taking lens to the mount section 13.

On the basis of the shake angle θ and the focal length f, the control circuit 914 calculates according to the following formula a distance δ1 (image pickup device travel δ1) by which the image pickup device 20 should be moved in response to the shake exerted to the camera body 10 (step S6).

$$\text{Image Pickup Device Travel } \delta 1 = f \cdot \tan \theta$$

This image pickup device travel ι1 correspond to the amount (px, py) of motion in each direction in the description given above.

On the other hand, the Hall sensor 57 (position detection sensor section 55) performs position detecting operation for the image pickup device 20 (step S7). The detected position signal is transmitted to the position detection processing circuit 913, so that position information δ2 indicating the present position of the image pickup device 20 is calculated (step S8). The position information δ2 is inputted to the control circuit 914.

The control circuit 914 receives the position information δ2, and thereby performs servo control (step S9). That is, a driving signal (drvx, drvy) for operating the pitch direction actuator 3a and the yaw direction actuator 3b is generated such that the calculated difference of the image pickup device travel δ1 from the position information δ2 should become zero (δ1−δ2=0) (step S9). The driving signal (drvx, drvy) is inputted to the drive circuit 916. Then, the drive circuit 916 generates a driving pulse for actually driving the pitch direction actuator 3a and the yaw direction actuator 3b.

As such, preferred embodiments of the invention has been described above. However, the invention is not limited to these embodiments. For example, the following modified embodiments may be implemented.

(1) The above-mentioned embodiments have been given for the case of the use of a so-called smooth impact type piezoelectric actuator that employs a piezoelectric element and a driving shaft in the actuator (driving section). However, the actuator may be of any type as long as a high speed response is obtained to a vibration exerted to the camera body 10 and the image pickup device 20 can be moved at least in two axis directions perpendicular to the optical axis. For example, an actuator employing a moving coil arranged such that a swing force can be exerted in two axis directions, an actuator constructed from a combination of a small electric motor and a gear system or a ball screw mechanism and the like, or an actuator employing a pressure mechanism may be used and arranged in a side end part of the image pickup device 20.

(2) Alternative, an actuator may be used that is located in one side tend part of the image pickup device 20 and capable of moving the image pickup device 20 in two axis directions perpendicular to the optical axis. This actuator (driving section) may be arranged in the side end 20b opposing the side end 20a adjacent to the control board 6 of the image pickup device 20 as shown in FIG. 1, or alternatively in the side end 20d opposing the side end 20c adjacent to the finder section 7 as shown in FIG. 2.

(3) The above-mentioned embodiments have been given for the case that the finder section 7 is an optical finder (the case of a single lens reflex type camera provided with a mirror section). However, the finder section 7 may be an electronic view finder or the like. Even in this case, when the actuator is arranged in the side end 20d opposing the side end 20c adjacent to the electronic view finder, the distance between the electronic view finder and the image pickup device 20 can be reduced, so that a compact design is achieved easily.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A camera with shake correction mechanism, comprising:
- an image pickup device for converting an optical image of an object formed by a taking lens, into an electrical image signal;
- a shake detecting device for detecting a shake exerted to a camera body;
- a shake correction unit having a driving section configured to exert a swing force for swinging the image pickup device in a direction perpendicular to an optical axis of the taking lens;
- a control board on which electronic components are mounted; and
- a flexible wiring member for electrically and directly connecting the shake correction unit to the control board,
- wherein the shake correction unit and the control board are arranged close to each other in a direction perpendicular to the optical axis without overlapping in the optical axis direction, and wherein the flexible wiring member has a deformable part, wherein the deformable part extends along the optical axis direction in a loop-like configuration in a space between the shake correction unit and the control board.

2. A camera according to claim 1, wherein the flexible wiring member is a flexible wiring board in which a plurality of conductors are aligned and arranged at predetermined intervals in a transverse direction, while upper and lower surfaces thereof are sealed with insulating films.

3. A camera according to claim 1, further comprising:
- a rectangular-tube shaped frame including a retractable-type reflecting mirror for reflecting object light therein;
- a mount section configured to be capable of exchanging the taking lens, the mount Section being attached on the front side of the frame;
- wherein the shake correction unit is attached on the rear side of the frame, and the flexible wiring member is accommodated in a planar space in alignment with a side wall part of the frame.

4. A camera according to claim 1, further comprising a flexible member guide section for guiding the flexible wiring member disposed on the shake correction unit.

* * * * *